(12) United States Patent
Warashina et al.

(10) Patent No.: US 8,335,031 B2
(45) Date of Patent: Dec. 18, 2012

(54) OPTICAL MODULE

(75) Inventors: Yoshihisa Warashina, Hamamatsu (JP); Tomofumi Suzuki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 132 days.

(21) Appl. No.: 12/689,413

(22) Filed: Jan. 19, 2010

(65) Prior Publication Data

US 2010/0188728 A1 Jul. 29, 2010

Related U.S. Application Data

(60) Provisional application No. 61/147,230, filed on Jan. 26, 2009.

(30) Foreign Application Priority Data

Jan. 26, 2009 (JP) ................................ P2009-014344

(51) Int. Cl.
*G02F 1/03* (2006.01)
*G02F 1/07* (2006.01)
*G02F 1/29* (2006.01)
*G02B 26/08* (2006.01)

(52) U.S. Cl. ........................................ 359/259; 359/298

(58) Field of Classification Search .......... 359/290–292, 359/298, 811, 813, 819–822, 824
See application file for complete search history.

(56) References Cited

U.S. PATENT DOCUMENTS 6,932,271 B2 * 8/2005 Nakajima et al. ............. 235/454
2010/0067084 A1 * 3/2010 Hagihara et al. ............ 359/221.2

FOREIGN PATENT DOCUMENTS

| JP | 2004-358603 | 12/2004 |
|---|---|---|
| JP | 2008-102132 | 5/2008 |
| WO | WO 2008/069394 | 6/2008 |
| WO | WO-2008/090921 A1 | 7/2008 |

* cited by examiner

*Primary Examiner* — Thomas K Pham
*Assistant Examiner* — Brandi Thomas
(74) *Attorney, Agent, or Firm* — Drinker Biddle & Reath LLP

(57) ABSTRACT

An optical module 1A is an optical module, which is manufactured from an SOI substrate having a support substrate 10 and a semiconductor layer 14 disposed on a surface 10a of the support substrate 10 via an insulating layer 12, the optical module including a movable mirror 22 in which a mirror surface 22a is formed on a side face intersecting with a Y-direction, that is movable in the Y-direction, a photodiode 32 which is provided on the surface 10a of the support substrate 10, and is optically coupled to the mirror surface 22a of the movable mirror 22, a cap member 34 which is provided on the surface 10a of the support substrate 10, that airtight-seals the movable mirror 22 and the photodiode 32, and an element electrode part 36 which is provided through the support substrate 10 and the insulating layer 12, and is electrically connected to the photodiode 32. Thereby, it is possible to realize an optical module which is capable of enhancing the airtightness of an optical system including a movable mirror, and which also can be downsized.

8 Claims, 21 Drawing Sheets

Fig.1
(a)
(b)
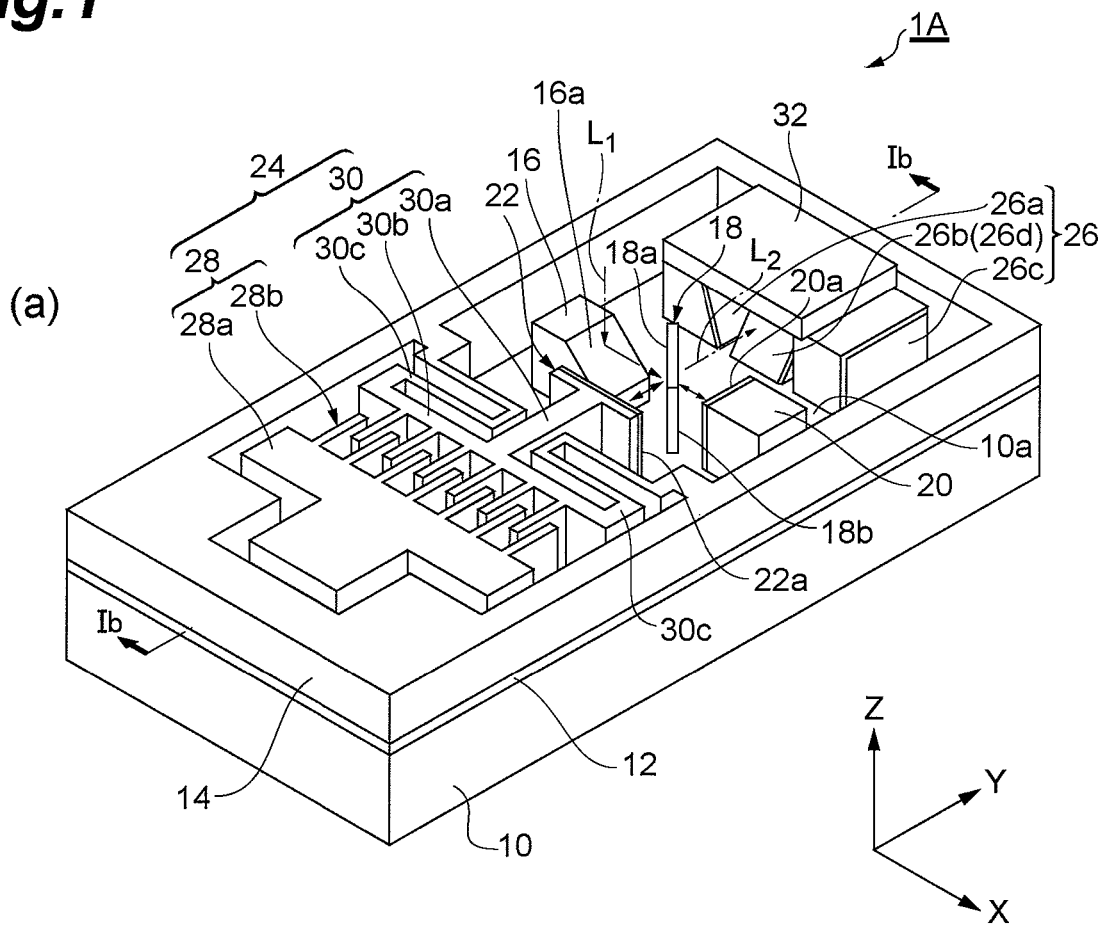
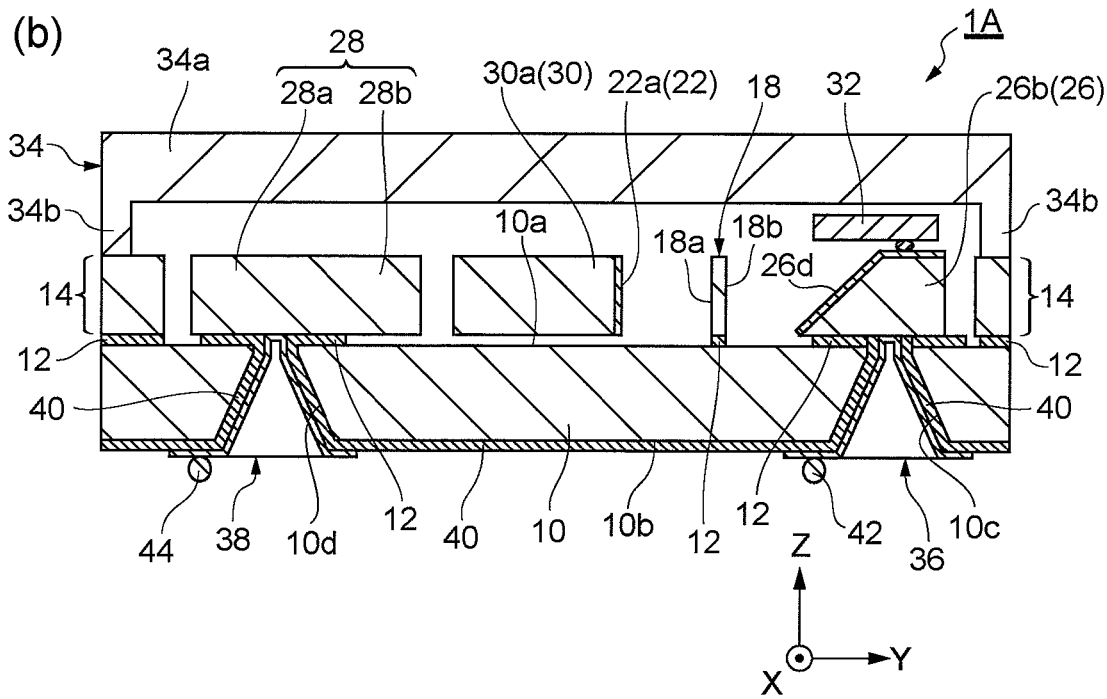

OPTICAL MODULE

CROSS-REFERENCE TO RELATED APPLICATION

This application claims priority to Provisional Application Ser. No. 61/147,230 filed on Jan. 26, 2009, which is hereby incorporated by reference in its entirety.

BACKGROUND OF THE INVENTION

1. Field of the Invention

The present invention relates to an optical module using a MEMS (Micro Electro Mechanical Systems) technology.

2. Related Background Art

In recent years, the development of MEMS devices manufactured by use of the MEMS technology has been advanced, and such MEMS devices can be put into practice as various optical components. For example, in Patent Document 1, there is disclosed an interference optical system which is configured on an SOI (Silicon On Insulator) substrate by use of the MEMS technology. The interference optical system according to Patent Document 1 includes a beam splitter, a movable mirror attached to an electrostatic actuator, and a fixed mirror, and these are formed by applying etching to a silicon layer and an insulating layer of an SOI substrate into arbitrary shapes. Then, a groove for installing an optical fiber therein is formed on the SOI substrate, and an interference light image generated by the interference optical system is led out to the outside via the optical fiber installed in the groove.

Patent Document 1: Japanese Patent Application Laid-Open No. 2008-102132

SUMMARY OF THE INVENTION

However, there are the following problems in the configuration described in Patent Document 1. That is, an interference optical image generated by the interference optical system is taken out via the optical fiber, and for this purpose, it is necessary to connect a photodetector to the optical fiber outside the device. Therefore, the entire apparatus is made larger in size. Further, because a driving part such as a movable mirror has a shape in dimensions from several μm to several tens of μm, that is minute, malfunction is easily caused therein due to dust, water droplets, and the like being adhered to a gap between the movable mirror and the substrate. Accordingly, in order to prevent invasion of dust, water droplets, and the like, an optical system including a movable mirror is preferably airtight-sealed, however, in a configuration in which an output light such as an interference optical image is taken out via an optical fiber, it is difficult to sufficiently secure the airtightness in the vicinity of the optical fiber.

The present invention has been achieved in consideration of the above-described problems, and an object of the present invention is to provide an optical module which is capable of enhancing the airtightness of an optical system including a movable mirror, and which can also be downsized.

In order to solve the above-described problems, there is provided an optical module according to the present invention, which is manufactured from a substrate product having a support substrate and a semiconductor layer disposed on one surface of the support substrate via an insulating layer, the optical module including a movable mirror which includes a portion of the semiconductor layer, and in which a mirror surface is formed on a side face intersecting with a predetermined direction, the movable mirror is movable in the predetermined direction along the one surface by eliminating the insulating layer between the portion of the semiconductor layer and the support substrate, an optical semiconductor element which is provided on the one surface of the support substrate, and is optically coupled to the mirror surface of the movable mirror, a cap member which is provided on the one surface of the support substrate, the cap member airtight-seals the movable mirror and the optical semiconductor element, and an element electrode part which is provided through the support substrate and the insulating layer, and is electrically connected to the optical semiconductor element.

In the optical module according to the present invention, the optical semiconductor element is provided on the support substrate, and the optical semiconductor element and the movable mirror are together airtight-sealed with the cap member. Then, the optical semiconductor element and the mirror surface of the movable mirror are optically coupled to one another. In accordance with such a configuration, there is no need to install an optical fiber for connecting to an external detector or the like as included in the device, that is disclosed in above-described Patent Document 1, and therefore, it is possible to enhance the airtightness of the optical system including the movable mirror with the cap member. Further, because the optical semiconductor element is provided on the support substrate, there is no need to provide a photodetector or the like outside the device, which makes it possible to downsize the module.

Further, in the case in which it is necessary to make electric connections with the structural members or electric elements on the support substrate, generally, a wiring pattern is formed on the support substrate, to be led out to the outside of the package of the module. However, the airtightness of the optical system including the movable mirror may be deteriorated due to the irregularity generated by such a wiring. There is also a method in which a place contacting the cap member is covered with an insulating film, and the insulating film is ground to flatten the contacting surface with the cap member, however, not only is the number of steps increased, but also, in some cases, it may be impossible to utilize such a method depending on a type of device. In contrast thereto, in the optical module according to the present invention, the element electrode part electrically connected to the optical semiconductor element is provided through the support substrate and the insulating layer. Thereby, it is possible to make an electric connection with the optical semiconductor element from above the other surface of the support substrate, and therefore, there is no need to lead out a wiring pattern on the one surface of the support substrate, and it is possible to further enhance the airtightness of the optical system including the movable mirror with the cap member.

In accordance with the above-described optical module, it is possible to enhance the airtightness of the optical system including the movable mirror, and to downsize the module.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 1 is a figure including diagrams showing a configuration of an optical module 1A as a first embodiment of an optical module according to the present invention, that show (a) a perspective view of the optical module 1A, and (b) a sectional side view of the optical module 1A taken along the line Ib-Ib in (a).

DESCRIPTION OF THE PREFERRED EMBODIMENTS

Figure 2:
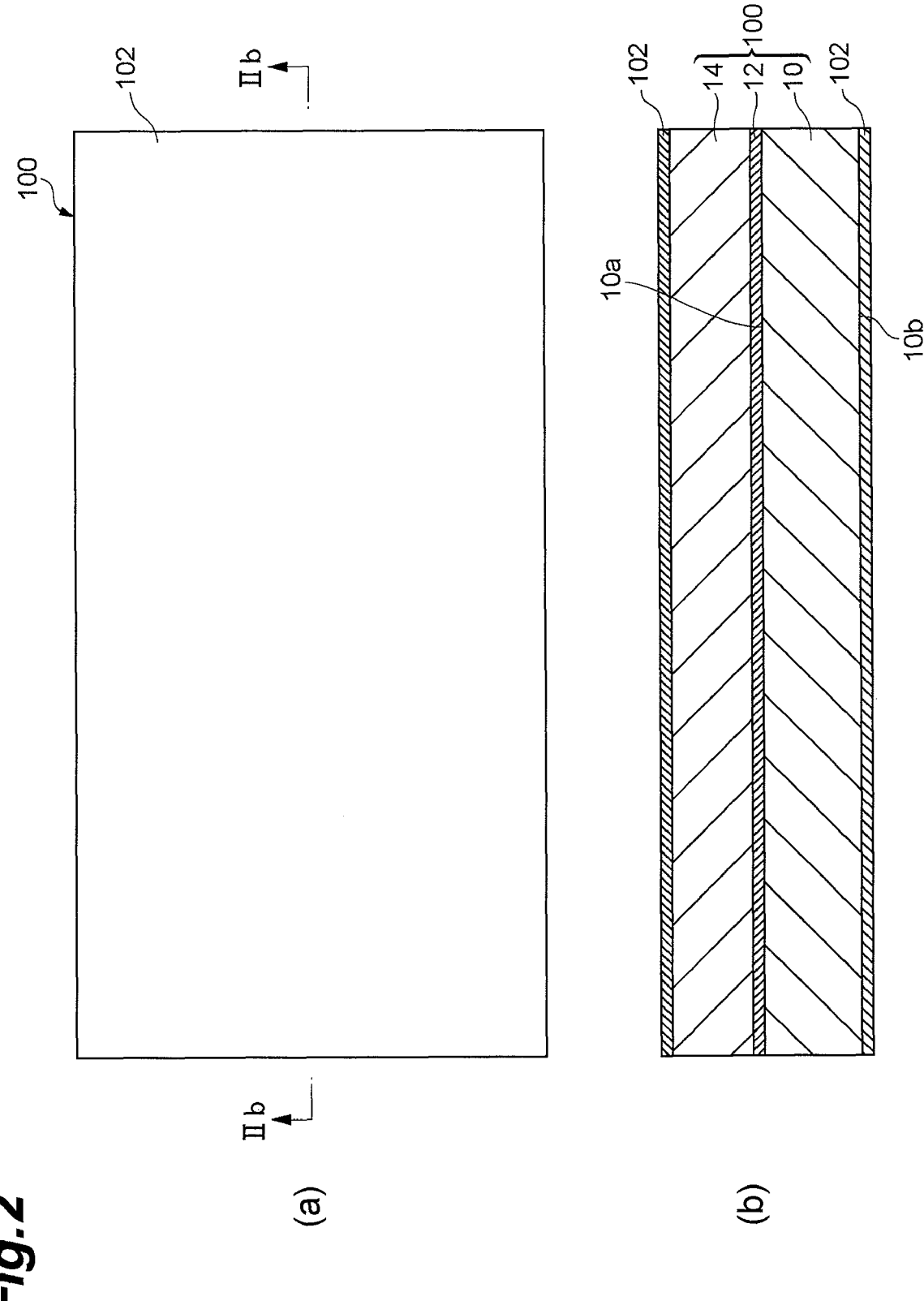
FIG. 2 is a figure including diagrams showing a manufacturing step of the optical module 1A, that show (a) a plan view of the optical module 1A in the process of manufacturing, and (b) an end elevational view thereof.

Hereinafter, embodiments of an optical module according to the present invention will be described in detail with reference to the accompanying drawings. Note that, in the descriptions of the drawings, same components are denoted by same reference numerals and letters, and overlapping descriptions will be omitted.

First Embodiment

FIG. 1 shows diagrams showing a configuration of an optical module 1A as a first embodiment of an optical module according to the present invention. Here, (a) in FIG. 1 shows a perspective view of the optical module 1A, and (b) in FIG. 1 shows a sectional side view of the optical module 1A taken along the line Ib-Ib in FIG. 1(a). Note that, in FIG. 1(a), a cap member 34 included in the optical module 1A is omitted in the illustration to facilitate understanding thereof. Further, XYZ orthogonal coordinate systems are shown in FIG. 1(a) and FIG. 1(b).

The optical module 1A is manufactured from a substrate product such as an SOI substrate, and the optical module includes a support substrate 10 made of silicon (Si) having a pair of surfaces 10a and 10b, an insulating layer 12 provided on the one surface 10a of the support substrate 10, and a conductive semiconductor layer 14 disposed on the surface 10a of the support substrate 10 via the insulating layer 12. The insulating layer 12 is made of, for example, oxide silicon ($SiO_2$), and the semiconductor layer 14 is made of, for example, Si.

A plurality of structural members for constituting a Michelson interference optical system are formed in the insulating layer 12 and the semiconductor layer 14. That is, the optical module 1A includes an entrance mirror 16, an optical branching part (beam splitter) 18, a fixed mirror 20, a movable mirror 22, an electrostatic actuator 24, and an element mounting part 26.

The entrance mirror 16 is primarily composed of a portion of the semiconductor layer 14, and is fixed to the surface 10a of the support substrate 10 via the insulating layer 12. The entrance mirror 16 has a mirror surface 16a inclined in the X-axis direction to the surface 10a of the support substrate 10. An inclined angle of the mirror surface 16a is, for example, 45 degrees to the surface 10a. A light to be measured $L_1$ is made to enter into the mirror surface 16a from a direction perpendicular to the surface 10a (the Z-axis direction). The entrance mirror 16 reflects the light to be measured $L_1$ to a direction along the surface 10a (the X-axis direction in the present embodiment).

The optical branching part 18 is primarily composed of a portion of the semiconductor layer 14, and is fixed to the surface 10a of the support substrate 10 via the insulating layer 12. The optical branching part 18 is provided in the X-axis direction with a space from the entrance mirror 16. The optical branching part 18 has a pair of semireflecting surfaces 18a and 18b extending along the direction perpendicular to the surface 10a of the support substrate 10 (the Z-axis direction). The one semireflecting surface 18a is inclined to an optical path of the light to be measured $L_1$ received from the entrance mirror 16, to reflect a part of the light to be measured $L_1$ toward the movable mirror 22 which will be described later. In the present embodiment, the semireflecting surface 18a is inclined at 45 degrees to the X-axis direction, and reflects a part of the light to be measured $L_1$ entering thereinto along the X-axis direction to the Y-axis direction. Further, the semireflecting surface 18a allows the other light to be measured $L_1$ except for the reflected part of the light to be measured $L_1$, to transmit therethrough.

The fixed mirror 20 is primarily composed of a portion of the semiconductor layer 14, and is fixed to the surface 10a of the support substrate 10 via the insulating layer 12. The fixed mirror 20 is provided in the X-axis direction with a space from the entrance mirror 16, and is disposed at a position so as to sandwich the optical branching part 18 with the entrance mirror 16. A mirror surface 20a is formed on a side face of the fixed mirror 20 facing the optical branching part 18. The mirror surface 20a is optically coupled to the other semireflecting surface 18b of the optical branching part 18. The fixed mirror 20 reflects the light to be measured $L_1$ transmitting through the optical branching part 18 toward the optical branching part 18. The reflected light to be measured $L_1$ is reflected toward the element mounting part 26 which will be described later, by the other semireflecting surface 18b of the optical branching part 18.

The movable mirror 22 is primarily composed of a portion of the semiconductor layer 14, and is movable in a predetermined direction along the surface 10a (the Y-axis direction in the present embodiment) by eliminating the insulating layer 12 between the portion of the semiconductor layer 14 and the support substrate 10. The movable mirror 22 has a side face facing the optical branching part 18 (i.e., a side face intersecting with the above-described predetermined direction), and a mirror surface 22a is formed on the side face. The mirror surface 22a is optically coupled to the one semireflecting surface 18a of the optical branching part 18. The movable mirror 22 reflects the light to be measured $L_1$ reflected by the semireflecting surface 18a of the optical branching part 18 toward the optical branching part 18. The reflected light to be measured $L_1$ transmits through the semireflecting surface 18a of the optical branching part 18, to be coupled to the light to be measured $L_1$ output from the fixed mirror 20 to become an interference optical image $L_2$, and the interference optical image goes toward the element mounting part 26.

The electrostatic actuator 24 is a driving part to displace the movable mirror 22 toward the Y-axis direction. The electrostatic actuator 24 has a first electrode 28 fixed to the surface 10a of the support substrate 10 and a second electrode 30 fixed to the movable mirror 22. The electrostatic actuator 24 is to generate electrostatic force between the first electrode 28 and the second electrode 30, to relatively displace the second electrode 30 with respect to the first electrode 28.

The first electrode 28 is disposed on the surface 10a of the support substrate 10. The first electrode 28 has a fixed part 28a fixed to the surface 10a of the support substrate 10 via the insulating layer 12, and a comb-structure part 28b formed on a side face of the fixed part 28a facing the second electrode 30. Here, the comb part 28b is in a state of floating from the support substrate 10 by eliminating the insulating layer 12 between the portion and the support substrate 10.

The second electrode 30 is disposed between the movable mirror 22 and the first electrode 28 on the surface 10a of the support substrate 10. The second electrode 30 has a columnar support 30a provided to be extended in the Y-axis direction to support the movable mirror 22 with its one end, a comb-structure part 30b which supports the other end of the columnar support 30a and is provided to be extended in the X-axis direction, and a supporting part 30c having a structure in which plate springs are connected, to elastically support the both ends of the comb-structure part 30b. The columnar support 30a, the comb part 30b, and the supporting part 30c are in a state of floating from the support substrate 10 by eliminating the insulating layer 12 between the portion and the support substrate 10. Further, one end of the supporting part 30c supports the end portion of the comb part 30b, and the other end of the supporting part 30c is fixed to the semiconductor layer 14 remaining on the rim portion of the optical module 1A. In accordance with such a configuration, the columnar support 30a and the comb-structure part 30b are capable of being displaced in the Y-axis direction. The comb-structure part 30b faces the comb-structure part 28b of the first electrode 28, and the comb teeth of the comb part 30b are disposed between the respective comb teeth of the comb part 28b.

When a predetermined voltage is applied to the second electrode 30, electrostatic force is applied between the comb-structure part 30b and the comb-structure part 28b. Because this electrostatic force is determined on the basis of a voltage value applied to the second electrode 30, a distance between the comb-structure part 30b and the comb-structure part 28b is controlled on the basis of the voltage value. That is, the positions in the Y-axis direction of the comb part 28b and the movable mirror 22 supported by the columnar support 30a are controlled on the basis of a voltage applied to the second electrode 30.

The element mounting part 26 is primarily composed of a portion of the semiconductor layer 14, and is fixed to the surface 10a of the support substrate 10 via the insulating layer 12. The element mounting part 26 is a structural member for mounting an optical semiconductor element such as a photodiode 32 thereon, which is provided on the surface 10a of the support substrate 10. The element mounting part 26 in the present embodiment is composed of three portions 26a to 26c arrayed in the X-axis direction. Metal films are formed on the top surfaces of these portions 26a to 26c, and the photodiode 32 is installed on these metal films. For example, a cathode electrode of the photodiode 32 is conductive-connected to the metal films of the two portions 26a and 26c located on the both ends. Further, an anode electrode of the photodiode 32 is conductive-connected to the metal film of the portion 26b located in the center.

Further, a mirror surface 26d is formed on one of the side faces of the portion 26b located in the center, which faces the movable mirror 22. The mirror surface 26d is inclined in the Y-axis direction to the surface 10a of the support substrate 10, and its inclined angle is, for example, 35 degrees to the surface 10a. The mirror surface 26d is optically coupled to the semireflecting surface 18b of the optical branching part 18. The interference optical image L₂ output from the optical branching part 18 enters into the mirror surface 26d. The mirror surface 26d reflects the interference optical image L₂ to the Z-axis direction, to cause the interference optical image to enter into the photodiode 32. That is, the photodiode 32 in the present embodiment is optically coupled to the mirror surface 22a of the movable mirror 22.

In addition to the configuration described above, the optical module 1A of the present embodiment further includes a cap member 34, an element electrode part 36, an actuator electrode part 38, and bump electrodes 42 and 44.

The cap member 34 is provided on the surface 10a of the support substrate 10, and is a member to airtight-seal the interference optical system including the entrance mirror 16, the optical branching part 18, the fixed mirror 20, the movable mirror 22, the electrostatic actuator 24, the element mounting part 26, and the photodiode 32. The cap member 34 has a planar shape which is substantially the same as the support substrate 10, and is composed of a top board portion 34a along the surface 10a and a rim portion 34b which is provided on the rim portion of the top board portion 34a, and is connected to the semiconductor layer 14 remaining on the periphery of the interference optical system. The cap member 34 (particularly, the top board portion 34a) is formed of a material allowing light having the wavelength of the light to be measured L₁ which is an object of light reception by the photodiode 32 to transmit therethrough. Thereby, it is possible for the light to be measured L₁ input from the outside of the optical module 1A to pass through the top board portion 34a of the cap member 34 to reach the entrance mirror 16.

The element electrode part 36 is an electrode part to make an electric connection with the photodiode 32. The element electrode part 36 is, as shown in FIG. 1(b), provided through the support substrate 10 and the insulating layer 12 immediately below the element mounting part 26. Here, a total of three element electrode parts 36 are singly provided to the respective three portions 26a to 26c of the element mounting part 26, however, the cross section of the element electrode part 36 corresponding to the portion 26b is shown as a representative of those in FIG. 1(b).

In detail, a through hole 10c is formed in the support substrate 10 and the insulating layer 12, and the upper end of the through hole 10c reaches the portion 26b of the element mounting part 26. Then, an insulating film 40 is formed on the inner side face of the through hole 10c, and a metal film serving as the element electrode part 36 is formed on the insulating film 40. The end of the element electrode part 36 contacts a portion, which is formed of the semiconductor layer 14, of the portion 26b of the element mounting part 26, and is electrically connected to the anode electrode of the photodiode 32 via the portion 26b. Further, the insulating film 40 is formed on the surface 10b of the support substrate 10 as well, and the element electrode part 36 is provided to be partially extended on a partial area of the insulating film 40.

The actuator electrode part 38 is an electrode part to make an electric connection with the electrostatic actuator 24. The actuator electrode part 38 is, as shown in FIG. 1(b), provided through the support substrate 10 and the insulating layer 12 immediately below the first electrode 28 of the electrostatic actuator 24. With respect to the second electrode 30 of the electrostatic actuator 24 as well, an actuator electrode part is provided in the same way immediately below the semiconductor layer 14 remaining on the rim portion of the optical module 1A, however, the cross section of the actuator electrode part 38 corresponding to the first electrode 28 is shown as a representative of those in FIG. 1(b). In detail, a through hole 10d is formed in the support substrate 10 and the insulating layer 12, and the upper end of the through hole 10d reaches the first electrode 28. Then, the insulating film 40 is formed on the inner side face of the through hole 10d, and a metal film serving as the actuator electrode part 38 is formed on the insulating film 40. The end of the actuator electrode part 38 contacts a portion, which is formed of the semiconductor layer 14, of the first electrode 28, and is electrically connected to the portion. Further, the actuator electrode part 38 is provided to be partially extended on a partial area of the insulating film 40 formed on the surface 10b.

The bump electrodes 42 and 44 are provided on the surface 10b of the support substrate 10, and those are respectively electrically connected to the element electrode part 36 and the actuator electrode part 38. In the present embodiment, the bump electrode 42 is formed on a portion, which is formed on the surface 10b, of the element electrode part 36, and the bump electrode 44 is formed on a portion, which is formed on the surface 10b, of the actuator electrode part 38.

A method of manufacturing the optical module 1A having the configuration described above will be described. FIGS. 2 to 20 are diagrams showing steps for manufacturing the optical module 1A in order. Here, in each of FIGS. 2 to 15, (a) shows a plan view of the optical module 1A in the process of manufacturing, and (b) shows an end elevational view thereof. Further, in each of FIGS. 16 to 20, (a) and (b) both show end elevational views of the optical module 1A in the process of manufacturing.

First, as shown in (a) in FIG. 2 and (b) in FIG. 2 that is an end elevational view taken along the line IIb-IIb, an SOI substrate 100 is prepared. This SOI substrate 100 has the support substrate 10 made of Si, the insulating layer 12 made of SiO₂, which is provided on the one surface 10a of the support substrate 10, and the semiconductor layer 14 made of Si, which is provided on the insulating layer 12. Si oxide films 102 are formed on the surface of the semiconductor layer 14 of the SOI substrate 100 and on the other surface 10b of the support substrate 10. At this time, it is preferable that the Si on the surfaces of the semiconductor layer 14 and the support substrate 10 be oxidized by use of, for example, wet oxidation method. Here, the Si oxide film 102 formed on the surface 10b will become the insulating film 40 shown in FIG. 1.

Figure 3:
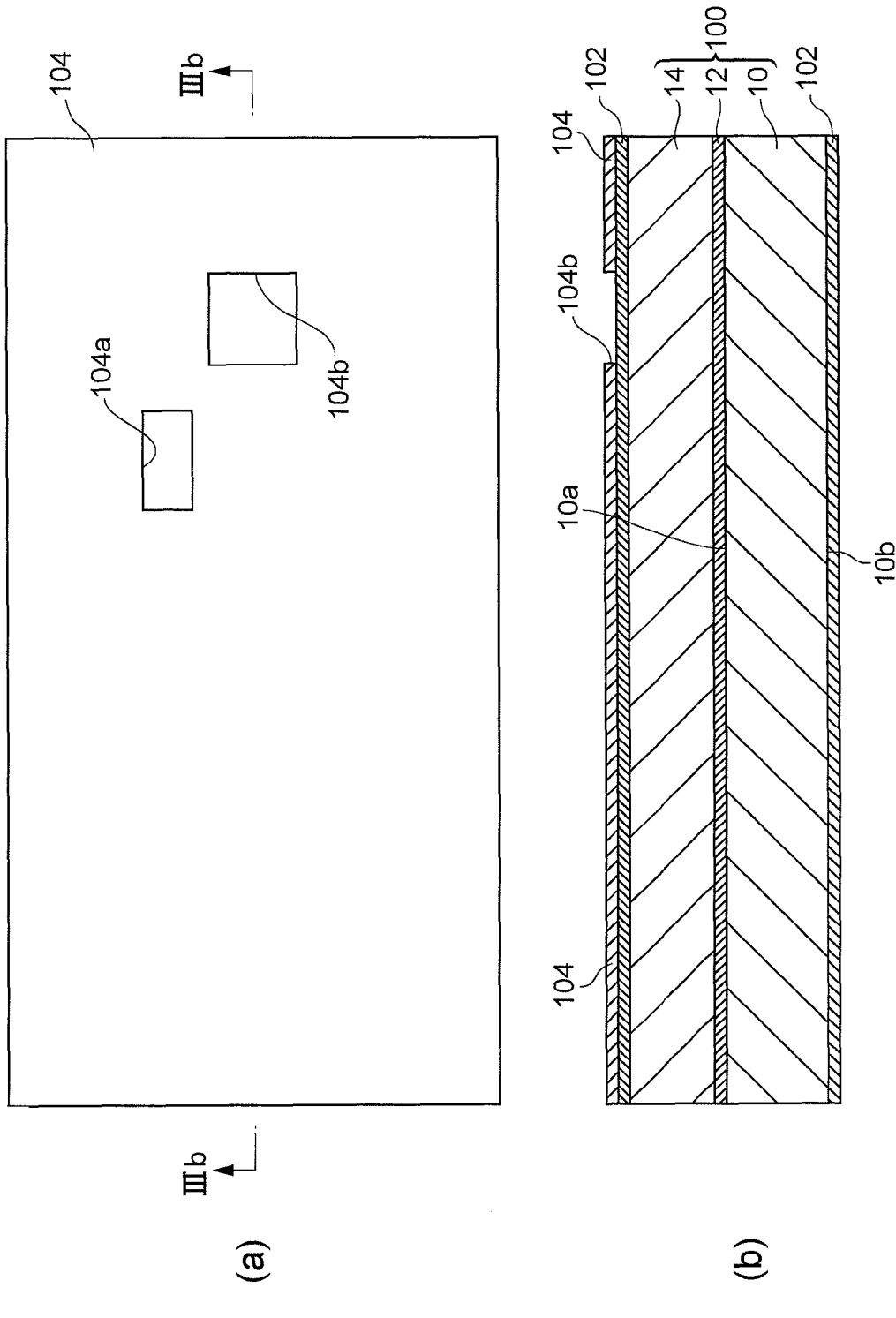
FIG. 3 is a figure including diagrams showing a manufacturing step of the optical module 1A, that show (a) a plan view of the optical module 1A in the process of manufacturing, and (b) an end elevational view thereof.
Figure 4:
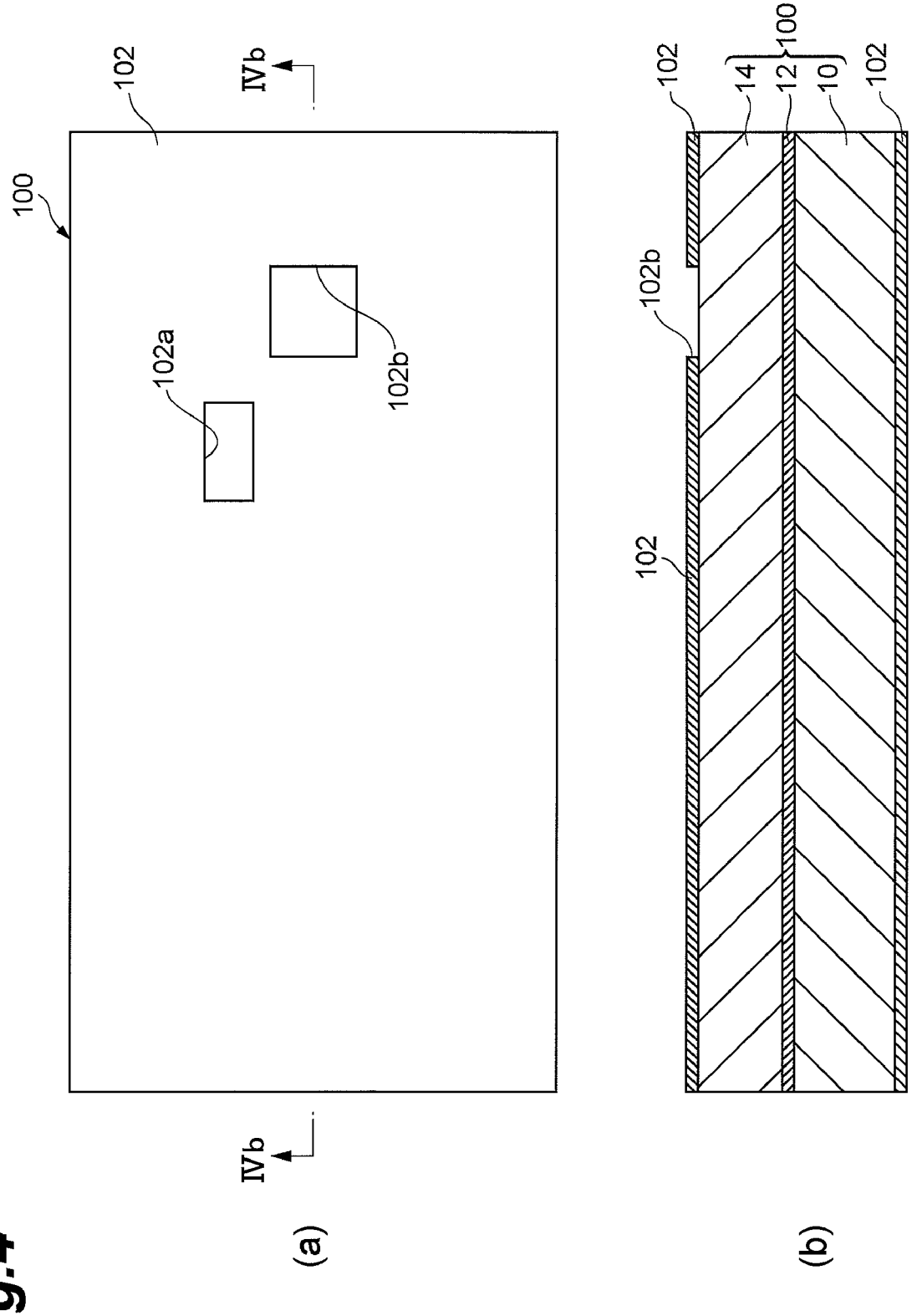
FIG. 4 is a figure including diagrams showing a manufacturing step of the optical module 1A, that show (a) a plan view of the optical module 1A in the process of manufacturing, and (b) an end elevational view thereof.

Next, as shown in (a) in FIG. 3 and (b) in FIG. 3 that is an end elevational view taken along the line IIIb-IIIb, a resist pattern 104 is formed on the Si oxide film 102 formed on the surface of the semiconductor layer 14. An opening 104a corresponding to the inclined mirror surface 16a of the entrance mirror 16 shown in FIG. 1(a), and an opening 104b corresponding to the inclined mirror surface 26d of the element mounting part 26 are formed in the resist pattern 104.

Next, dry etching is applied to the Si oxide film 102 formed on the surface of the semiconductor layer 14 via the resist pattern 104. Thereby, as shown in (a) in FIG. 4 and (b) in FIG. 4 that is an end elevational view taken along the line IVb-IVb, an opening 102a corresponding to the inclined mirror surface 16a of the entrance mirror 16, and an opening 102b corresponding to the inclined mirror surface 26d of the element mounting part 26 are formed in the Si oxide film 102. Thereafter, the resist pattern 104 is eliminated.

Figure 5:
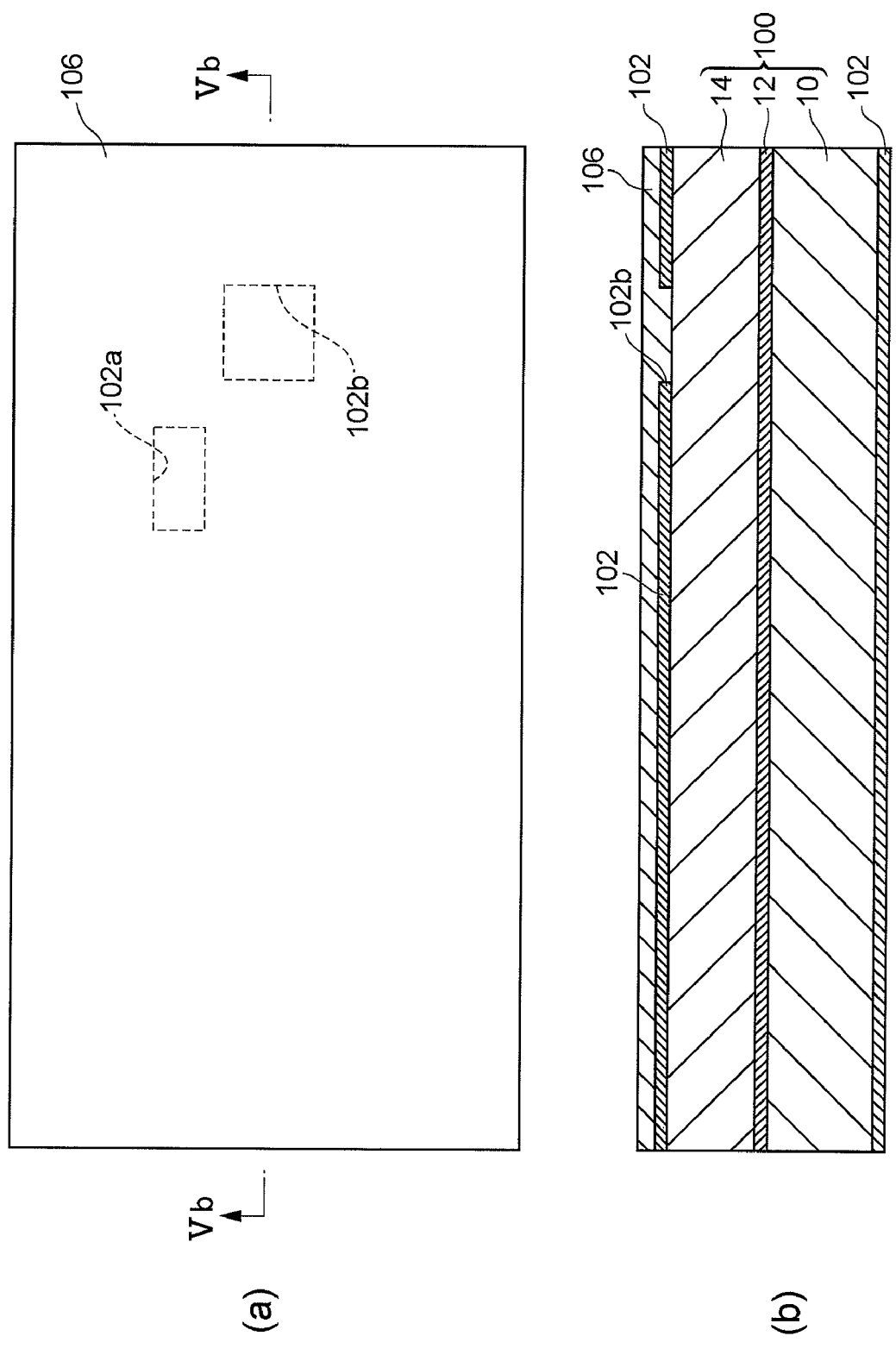
FIG. 5 is a figure including diagrams showing a manufacturing step of the optical module 1A, that show (a) a plan view of the optical module 1A in the process of manufacturing, and (b) an end elevational view thereof.

Next, as shown in (a) in FIG. 5 and (b) in FIG. 5 that is an end elevational view taken along the line Vb-Vb, an Si nitride film 106 is formed on the entire area on the semiconductor layer 14 of the SOI substrate 100. At this time, it is preferable that SiN be formed as a film on the semiconductor layer 14 (on the Si oxide film 102 for an area on which the Si oxide film 102 is formed) by, for example, an LP-CVD (Low Pressure-Chemical Vapor Deposition) method.

Figure 6:
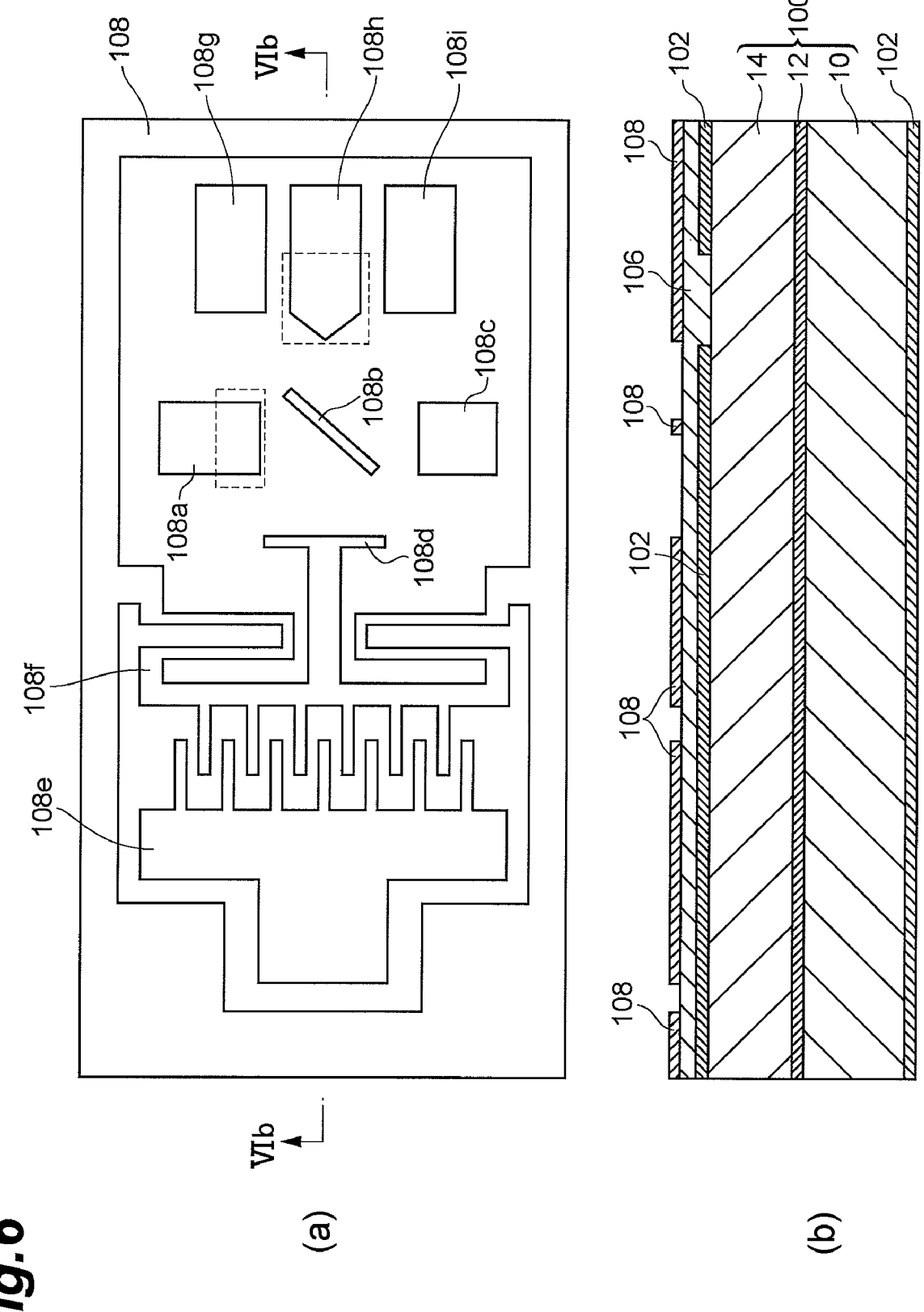
FIG. 6 is a figure including diagrams showing a manufacturing step of the optical module 1A, that show (a) a plan view of the optical module 1A in the process of manufacturing, and (b) an end elevational view thereof.
Figure 7:
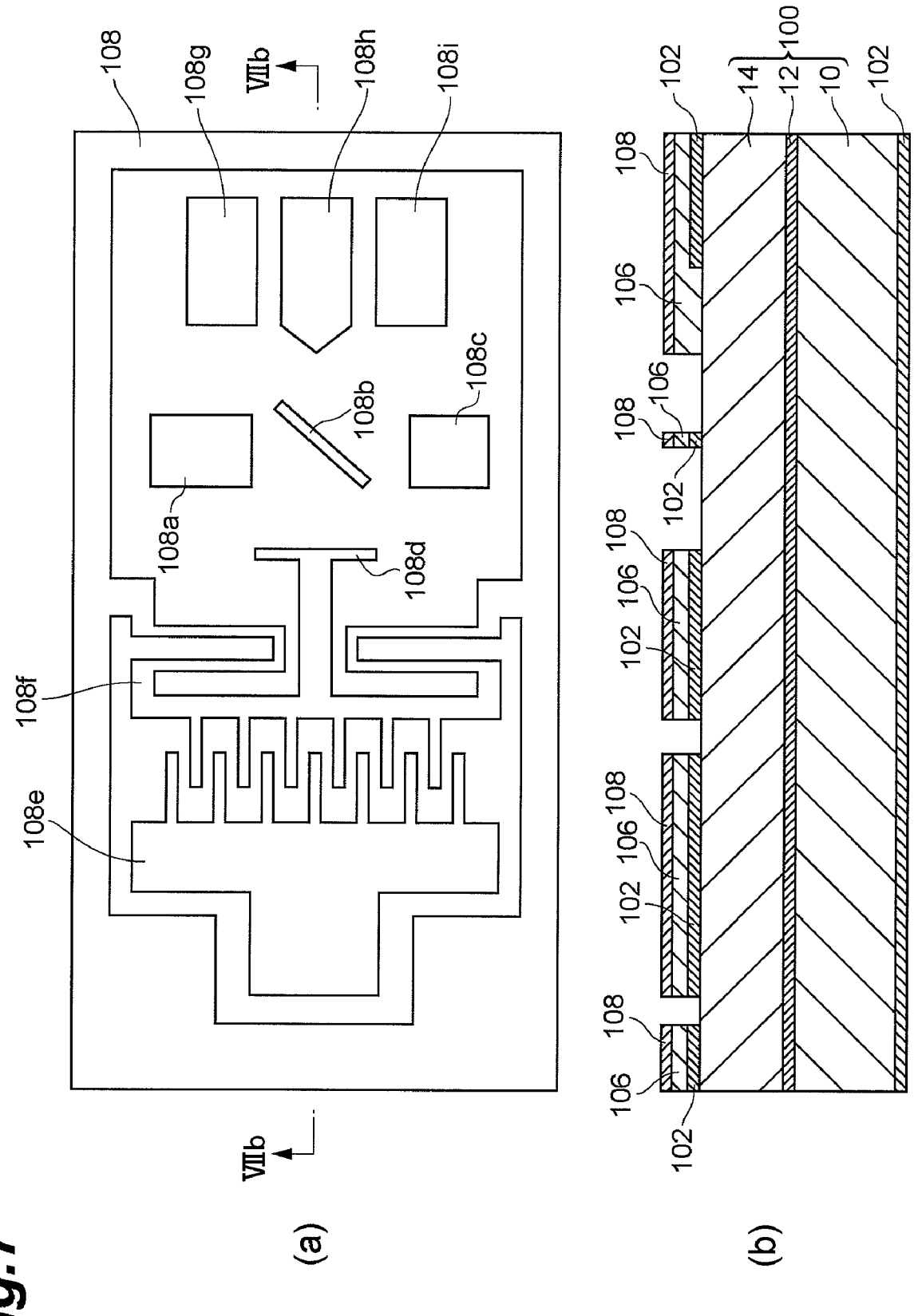
FIG. 7 is a figure including diagrams showing a manufacturing step of the optical module 1A, that show (a) a plan view of the optical module 1A in the process of manufacturing, and (b) an end elevational view thereof.

Next, as shown in (a) in FIG. 6 and (b) in FIG. 6 that is an end elevational view taken along the line VIb-VIb, a resist pattern 108 is formed on the Si nitride film 106. In this resist pattern 108, a pattern 108a corresponding to the entrance mirror 16 shown in FIG. 1(a), a pattern 108b corresponding to the optical branching part 18, a pattern 108c corresponding to the fixed mirror 20, a pattern 108d corresponding to the movable mirror 22, a pattern 108e corresponding to the first electrode 28 of the electrostatic actuator 24, a pattern 108f corresponding to the second electrode 30 of the electrostatic actuator 24, and patterns 108g to 108i corresponding to the respective portions 26a to 26c of the element mounting part 26 are formed.

Next, dry etching is applied to the Si nitride film 106 and the Si oxide film 102 under the Si nitride film via the resist pattern 108. Thereby, as shown in (a) in FIG. 7 and (b) in FIG. 7 that is an end elevational view taken along the line VIIb-VIIb, a plurality of patterns respectively corresponding to the entrance mirror 16, the optical branching part 18, the fixed mirror 20, the movable mirror 22, the electrostatic actuator 24 (the first electrode 28 and the second electrode 30), and the respective portions 26a to 26c of the element mounting part 26 are formed in the Si nitride film 106 and the Si oxide film 102.

Figure 8:
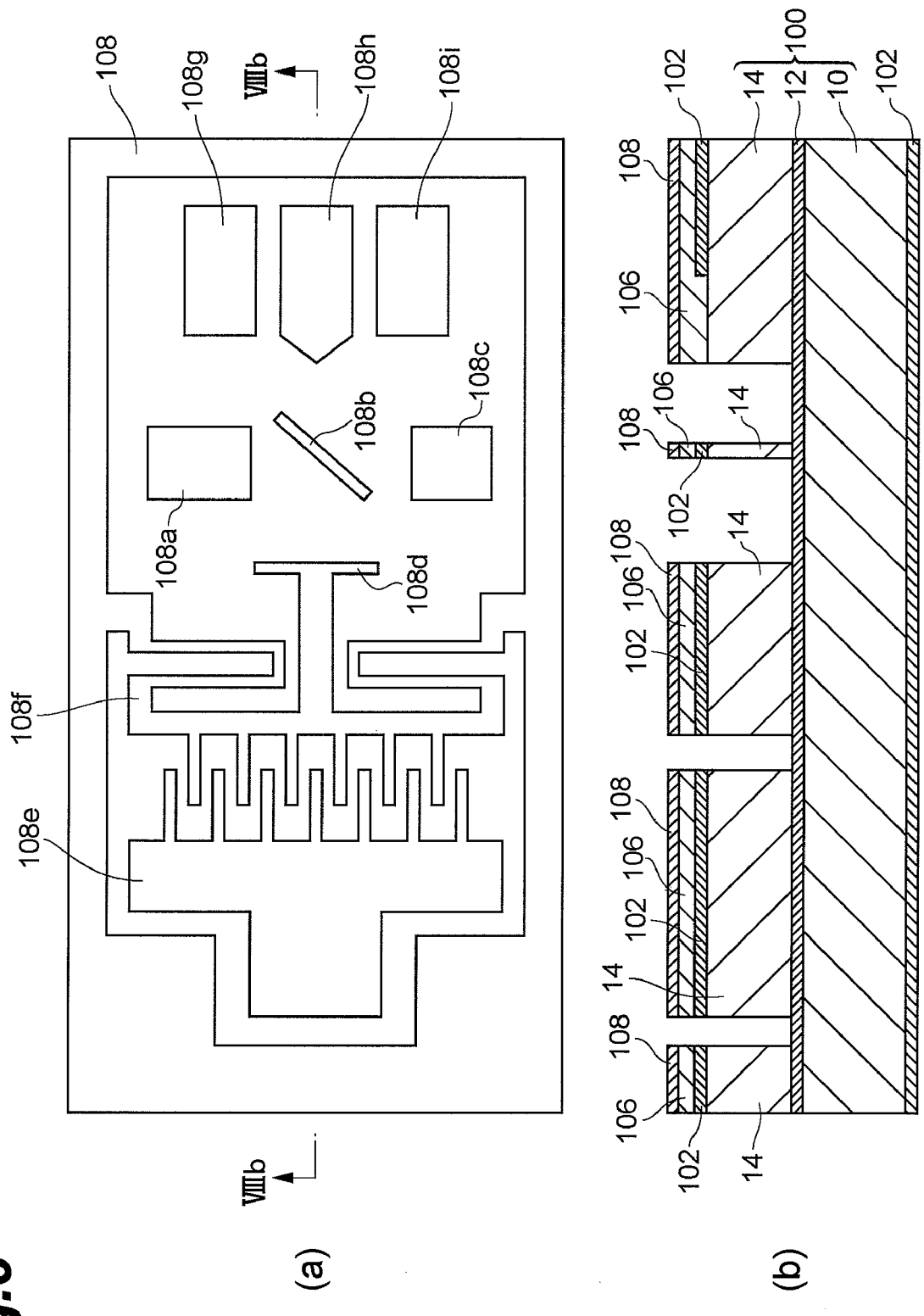
FIG. 8 is a figure including diagrams showing a manufacturing step of the optical module 1A, that show (a) a plan view of the optical module 1A in the process of manufacturing, and (b) an end elevational view thereof.
Figure 9:
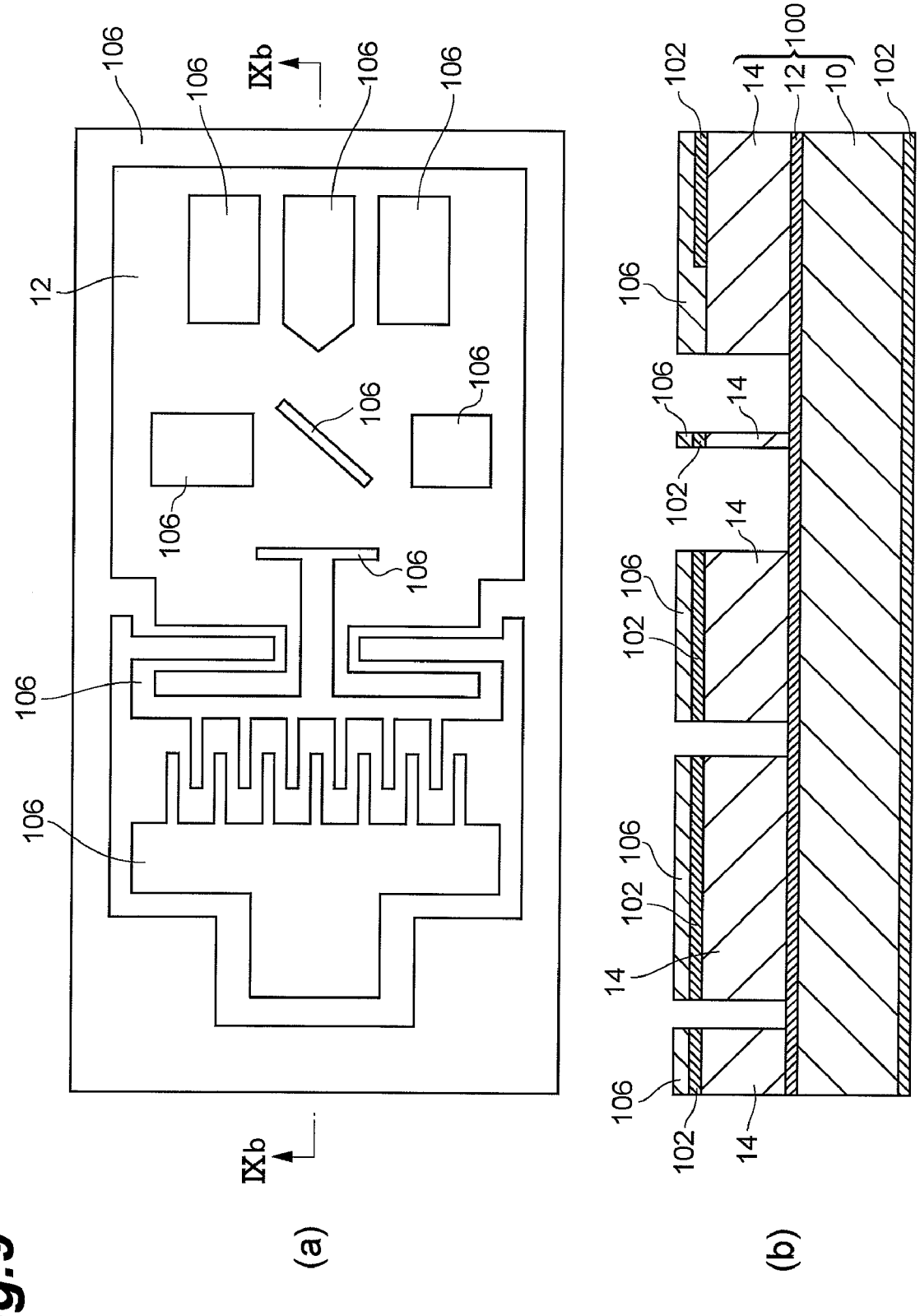
FIG. 9 is a figure including diagrams showing a manufacturing step of the optical module 1A, that show (a) a plan view of the optical module 1A in the process of manufacturing, and (b) an end elevational view thereof.

Next, as shown in (a) in FIG. 8 and (b) in FIG. 8 that is an end elevational view taken along the line VIIIb-VIIIb, dry etching is applied to the semiconductor layer 14 via the Si nitride film 106 and the Si oxide film 102. At this time, the etching is applied to the semiconductor layer 14 until the insulating layer 12 is exposed. Thereby, the respective portions composing the entrance mirror 16, the optical branching part 18, the fixed mirror 20, the movable mirror 22, the electrostatic actuator 24 (the first electrode 28 and the second electrode 30), and the respective portions 26a to 26c of the element mounting part 26 are formed in the semiconductor layer 14. Thereafter, the resist pattern 108 is eliminated (refer to (a) in FIG. 9 and (b) in FIG. 9 that is an end elevational view taken along the line IXb-IXb).

Figure 10:
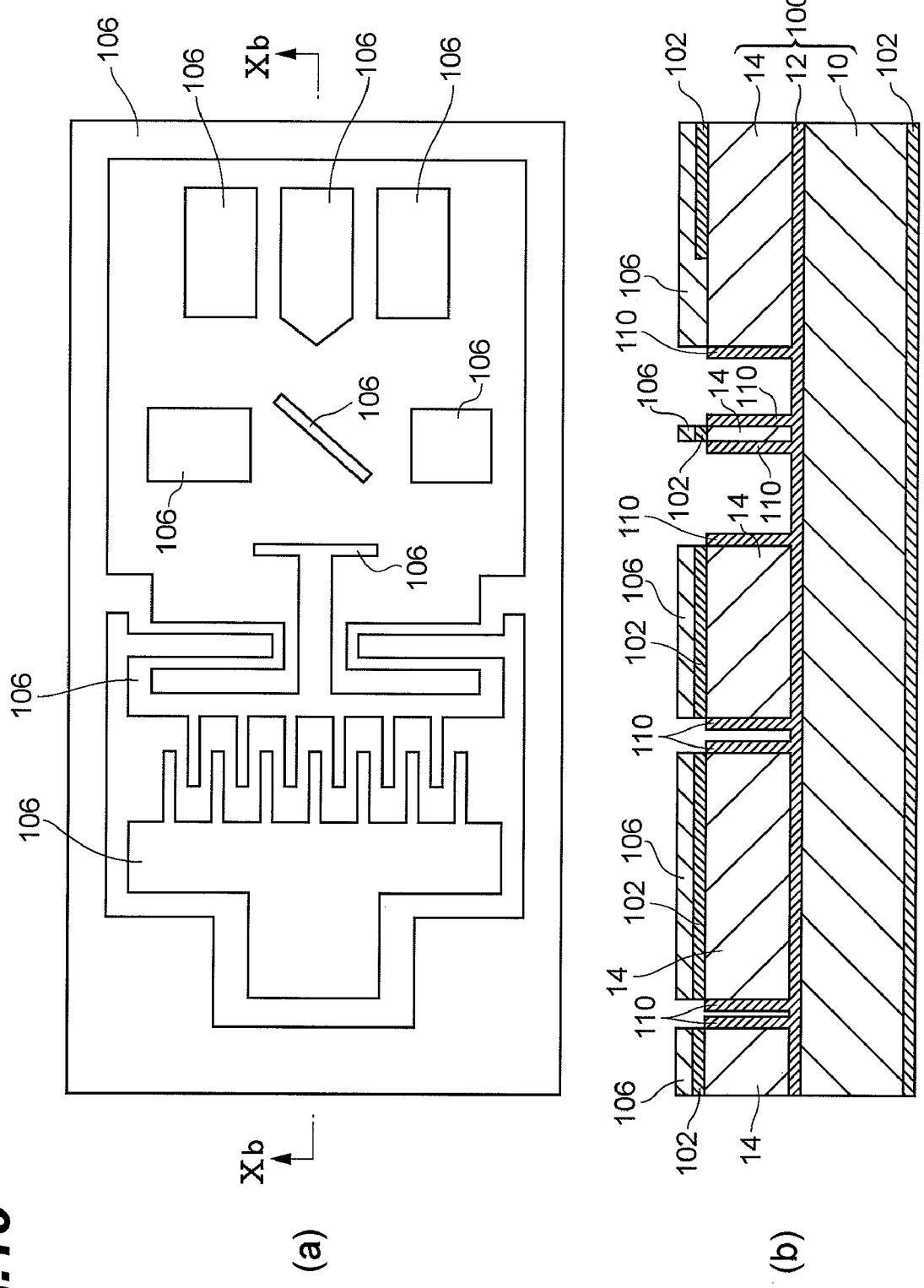
FIG. 10 is a figure including diagrams showing a manufacturing step of the optical module 1A, that show (a) a plan view of the optical module 1A in the process of manufacturing, and (b) an end elevational view thereof.

Next, as shown in (a) in FIG. 10 and (b) in FIG. 10 that is an end elevational view taken along the line Xb-Xb, Si oxide films 110 are formed on the side faces of the semiconductor layer 14 in order to protect the exposed side faces of the semiconductor layer 14. At this time, it is preferable that the Si on the exposed side faces of the semiconductor layer 14 be oxidized by use of, for example, wet oxidation method.

Figure 11:
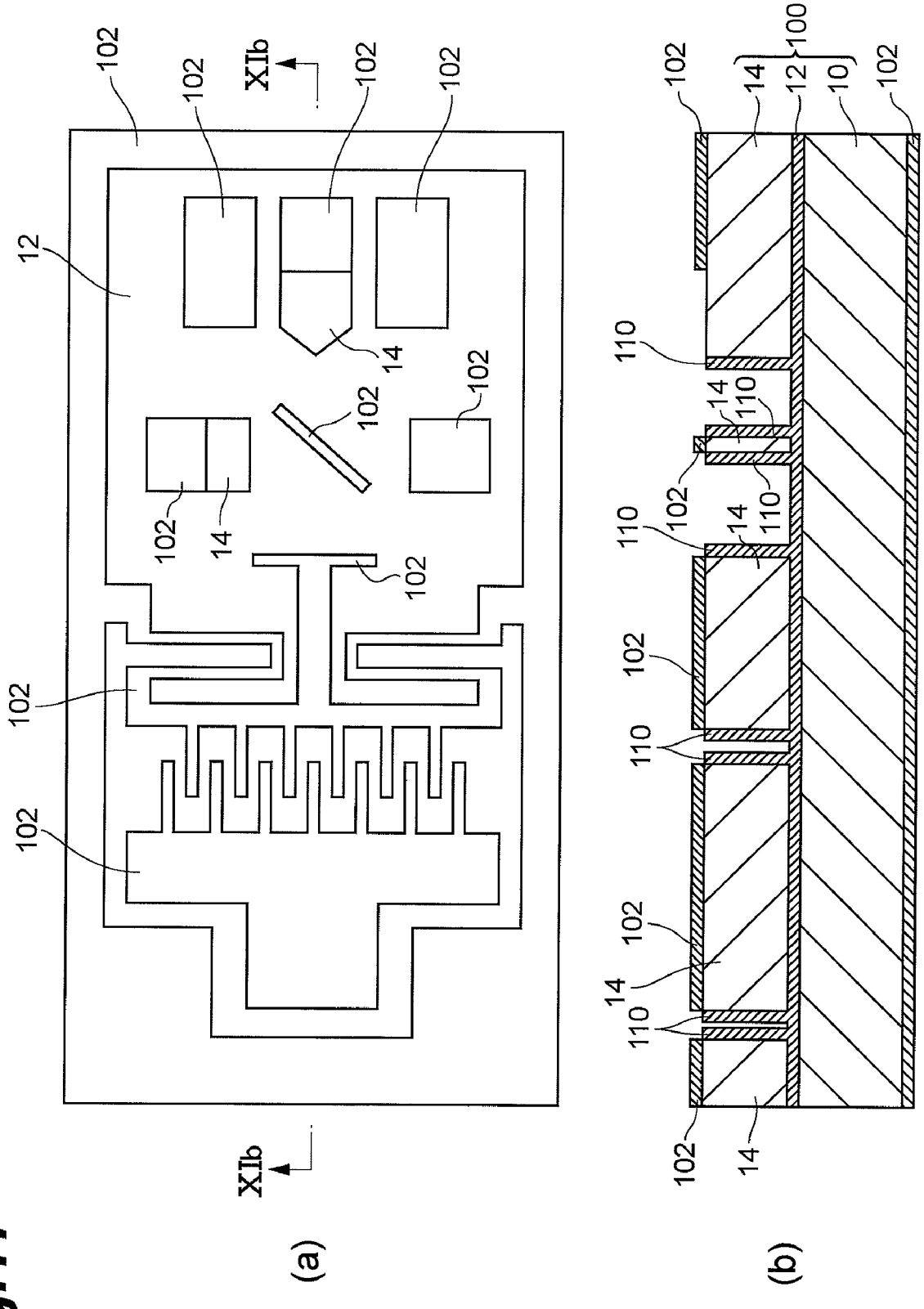
FIG. 11 is a figure including diagrams showing a manufacturing step of the optical module 1A, that show (a) a plan view of the optical module 1A in the process of manufacturing, and (b) an end elevational view thereof.

Next, as shown in (a) in FIG. 11 and (b) in FIG. 11 that is an end elevational view taken along the line XIb-XIb, the Si nitride film 106 is eliminated. At this time, the etching is applied only to the Si nitride film 106 selectively so as to leave the Si oxide film 102 by use of, for example, hot phosphoric acid (heated phosphoric acid solution) or the like. Thereby, the opening in the Si oxide film 102 corresponding to the inclined mirror surface 16a of the entrance mirror 16 and the opening in the Si oxide film 102 corresponding to the inclined mirror surface 26d of the element mounting part 26 make their appearances again, and the semiconductor layer 14 on the corresponding portions is exposed.

Figure 12:
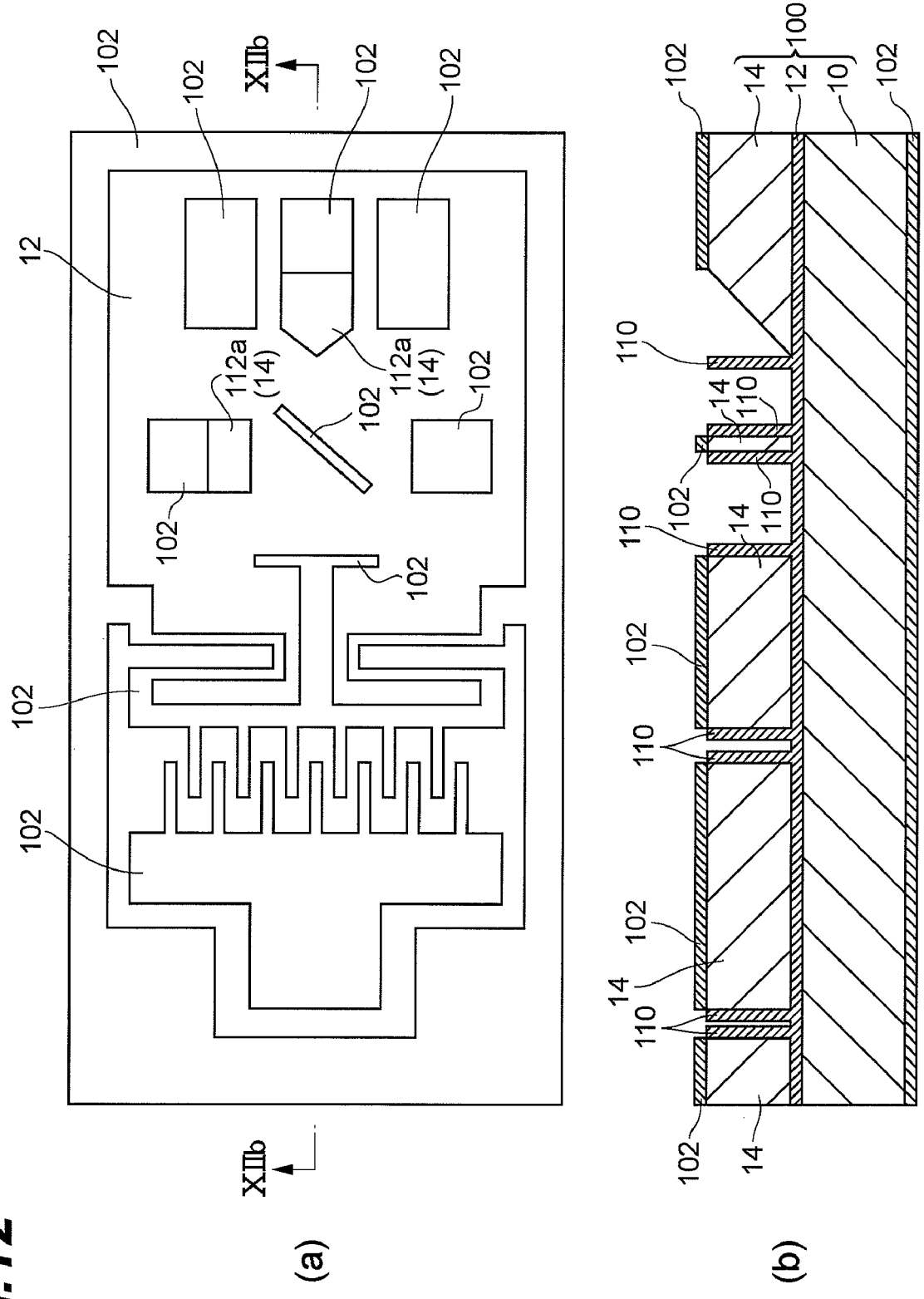
FIG. 12 is a figure including diagrams showing a manufacturing step of the optical module 1A, that show (a) a plan view of the optical module 1A in the process of manufacturing, and (b) an end elevational view thereof.

Next, as shown in (a) in FIG. 12 and (b) in FIG. 12 that is an end elevational view taken along the line XIIb-XIIb, wet etching is applied to the exposed semiconductor layer 14. At this time, anisotropic etching is applied to the exposed portions of the semiconductor layer 14 by use of, for example, alkaline etching. Thereby, respective inclined surfaces 112a and 112b which will become the inclined mirror surface 16a of the entrance mirror 16 and the mirror surface 26d of the element mounting part 26 are formed in the semiconductor layer 14.

Figure 13:
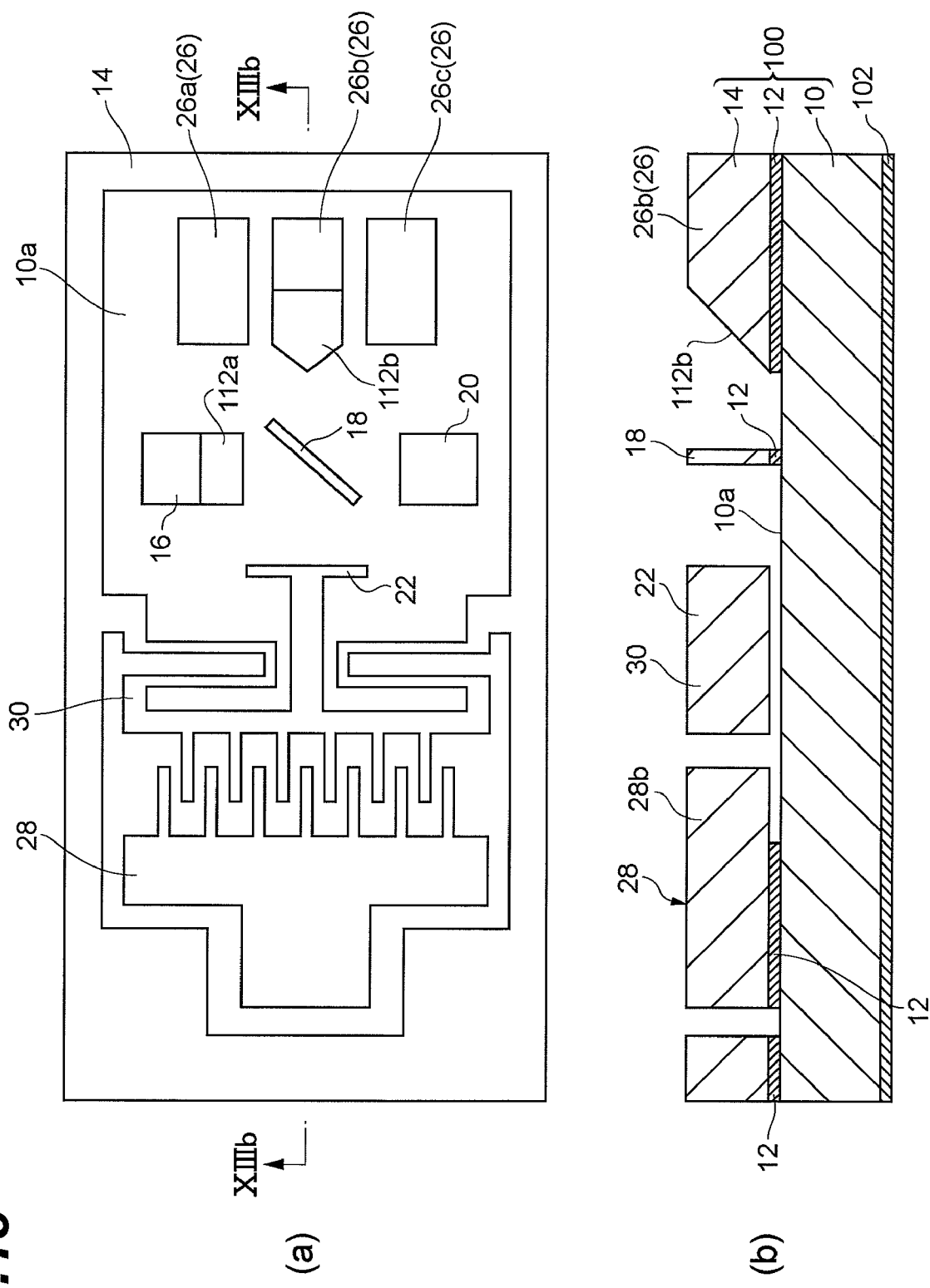
FIG. 13 is a figure including diagrams showing a manufacturing step of the optical module 1A, that show (a) a plan view of the optical module 1A in the process of manufacturing, and (b) an end elevational view thereof.

Next, as shown in (a) in FIG. 13 and (b) in FIG. 13 that is an end elevational view taken along the line XIIIb-XIIIb, wet etching by use of an etchant such as, for example, an HF solution is applied thereto, to eliminate the portions, which are formed on the semiconductor layer 14, of the Si oxide film 102, the Si oxide films 110, and some (mainly the exposed portions) of the insulating layer 12. At this time, by eliminating the insulating layer 12 between the portion which will be the movable mirror 22, the portion which will be the second electrode 30 of the electrostatic actuator 24, and the portion which will be the comb-structure part 28b of the first electrode of the semiconductor layer 14 and the support substrate 10, these portions are brought into a state of floating from the support substrate 10 (sacrifice layer etching). In accordance with this step, the entrance mirror 16, the optical branching part 18, the fixed mirror 20, and the respective portions 26a to 26c of the element mounting part 26 make their appearances, and the movable mirror 22 and the electrostatic actuator 24 (the first electrode 28 and the second electrode 30) are formed.

Figure 14:
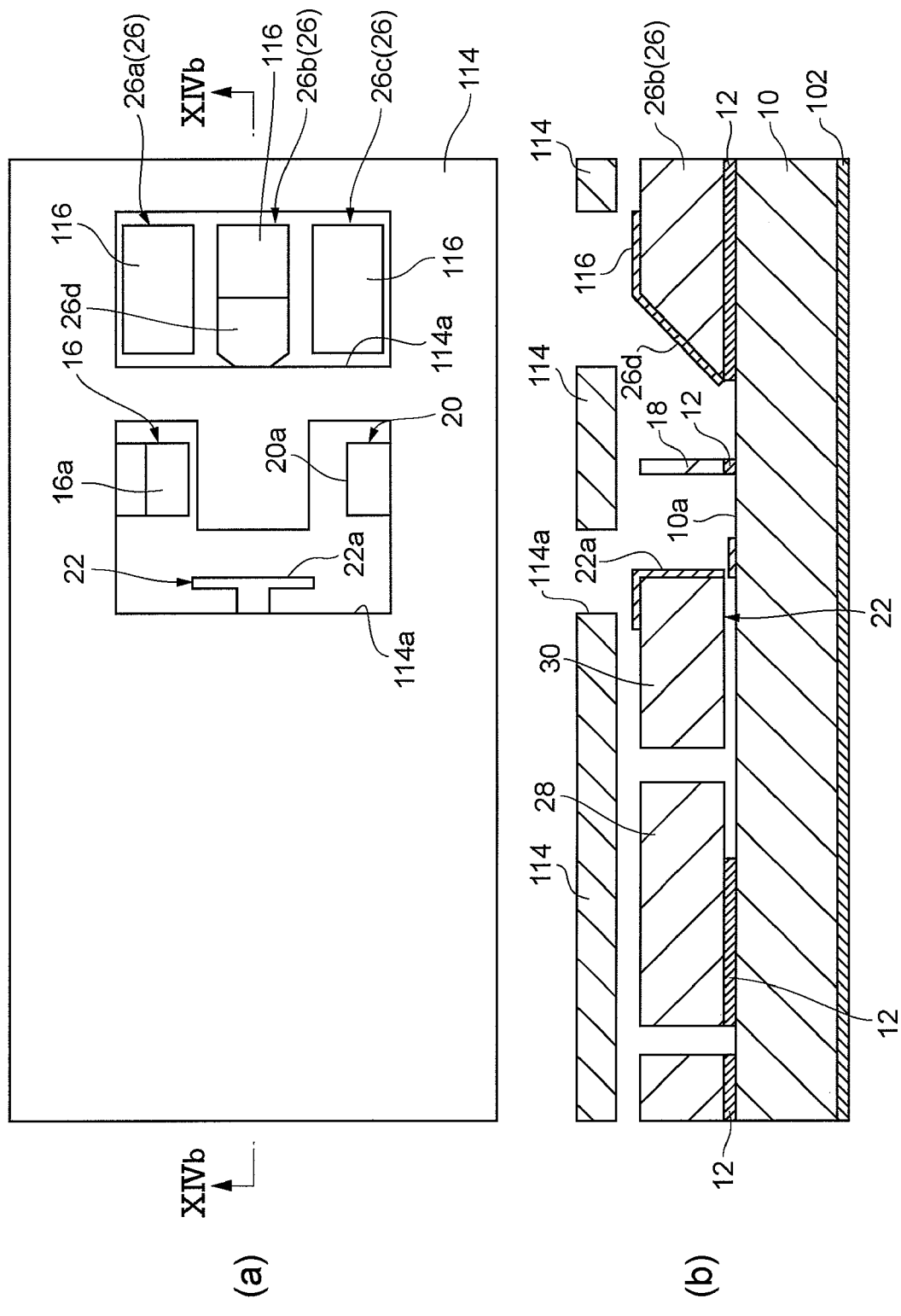
FIG. 14 is a figure including diagrams showing a manufacturing step of the optical module 1A, that show (a) a plan view of the optical module 1A in the process of manufacturing, and (b) an end elevational view thereof.

Next, as shown in (a) in FIG. 14 and (b) in FIG. 14 that is an end elevational view taken along the line XIVb-XIVb, the mirror surface 16a of the entrance mirror 16, the mirror surface 20a of the fixed mirror 20, the mirror surface 22a of the movable mirror 22, the mirror surface 26d of the element mounting part 26, and metal films 116 on the element mounting part 26 are formed. First, a shadow mask 114 is disposed so as to cover the surface 10a side of the support substrate 10. In the shadow mask 114, openings 114a corresponding to the portion which will be the mirror surface 16a in the entrance mirror 16, the portion which will be the mirror surface 20a in the fixed mirror 20, the portion which will be the mirror surface 22a in the movable mirror 22, and the entire element mounting part 26 are formed. Then, physical vapor deposition or the like of a metal material is applied via the shadow mask 114 thereto, to form metal films on the above-described respective portions. Thereby, the mirror surfaces 16a, 20a, 22a, and 26d, and the metal films 116 on the element mounting part 26 are formed. Thereafter, the shadow mask 114 is eliminated.

Figure 15:
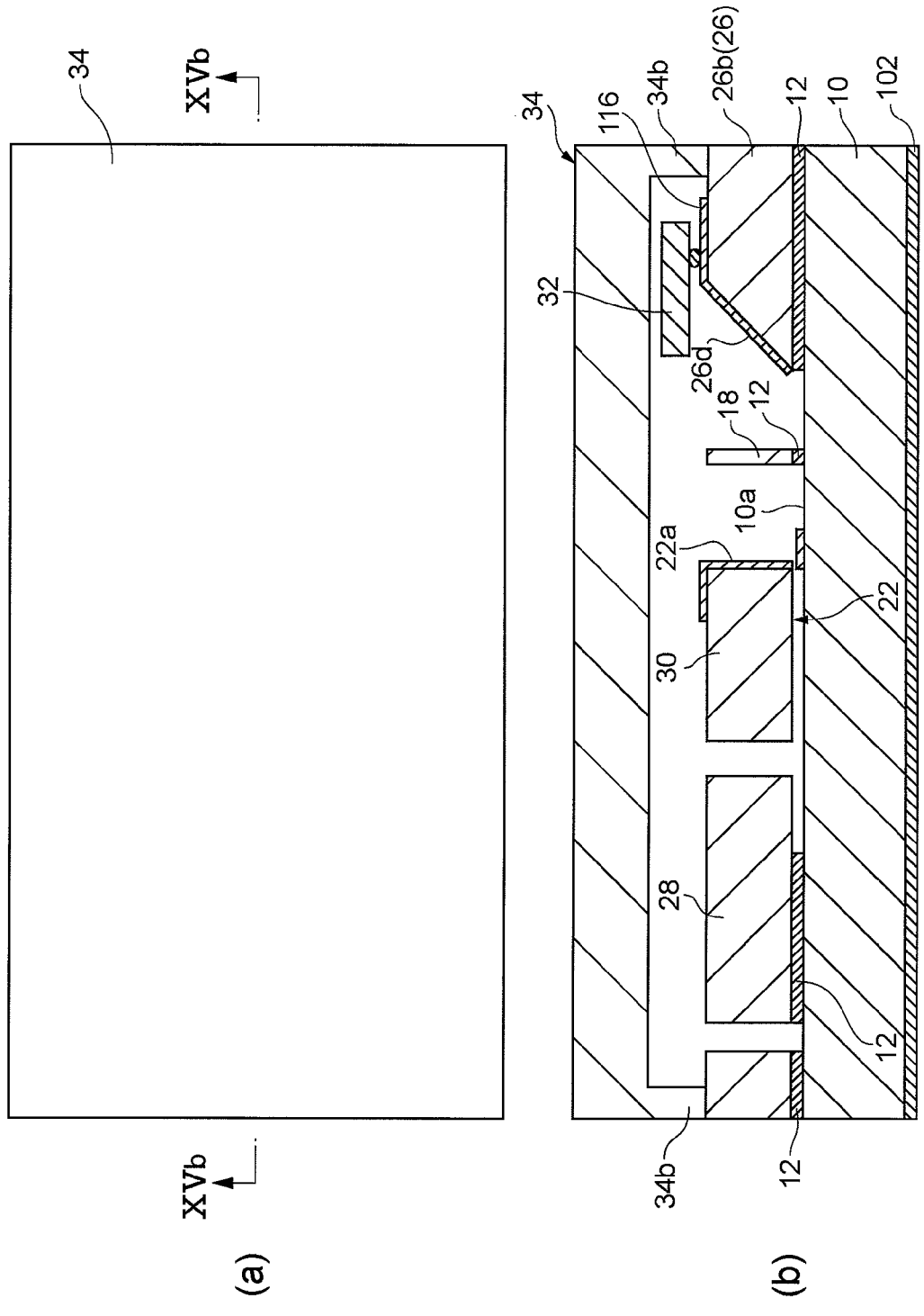
FIG. 15 is a figure including diagrams showing a manufacturing step of the optical module 1A, that show (a) a plan view of the optical module 1A in the process of manufacturing, and (b) an end elevational view thereof.

Next, as shown in (a) in FIG. 15 and (b) in FIG. 15 that is an end elevational view taken along the line XVb-XVb, the photodiode 32 is installed on the element mounting part 26. Then, the surface 10a side of the support substrate 10 is covered with the cap member 34. At this time, the rim portion 34b of the cap member 34 and the top surface of the semiconductor layer 14 remaining on the rim portion of the surface 10a of the support substrate 10 are connected to each other, to airtight-seal up the interference optical system including the movable mirror 22 and the photodiode 32.

Next, the element electrode part 36 and the actuator electrode part 38 (refer to FIG. 1) are formed. First, as shown in (a) in FIG. 16, a resist pattern 118 is formed on the Si oxide film 102 formed on the surface 10b of the support substrate 10. An opening 118a corresponding to the through hole 10c shown in FIG. 1(b) and an opening 118b corresponding to the through hole 10d are formed in the resist pattern 118.

Figure 16:
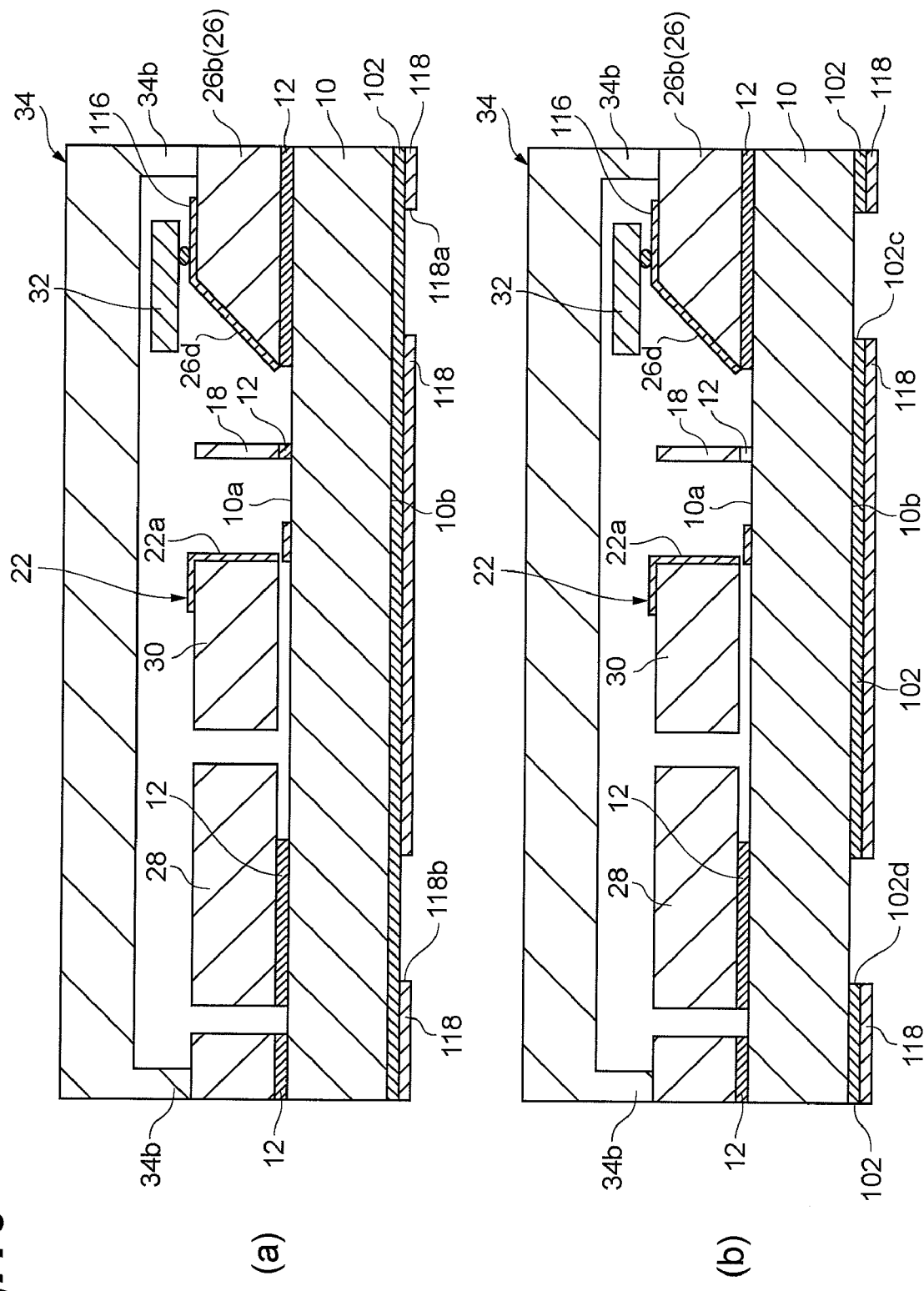
FIG. 16 is a figure including diagrams showing manufacturing steps of the optical module 1A, that show end elevational views of the optical module 1A in the process of manufacturing.

Next, as shown in (b) in FIG. 16, dry etching is applied to the Si oxide film 102 formed on the surface 10b via the resist pattern 118. Thereby, an opening 102c corresponding to the through hole 10c and an opening 102d corresponding to the through hole 10d are formed in the Si oxide film 102. Thereafter, the resist pattern 118 is eliminated.

Figure 17:
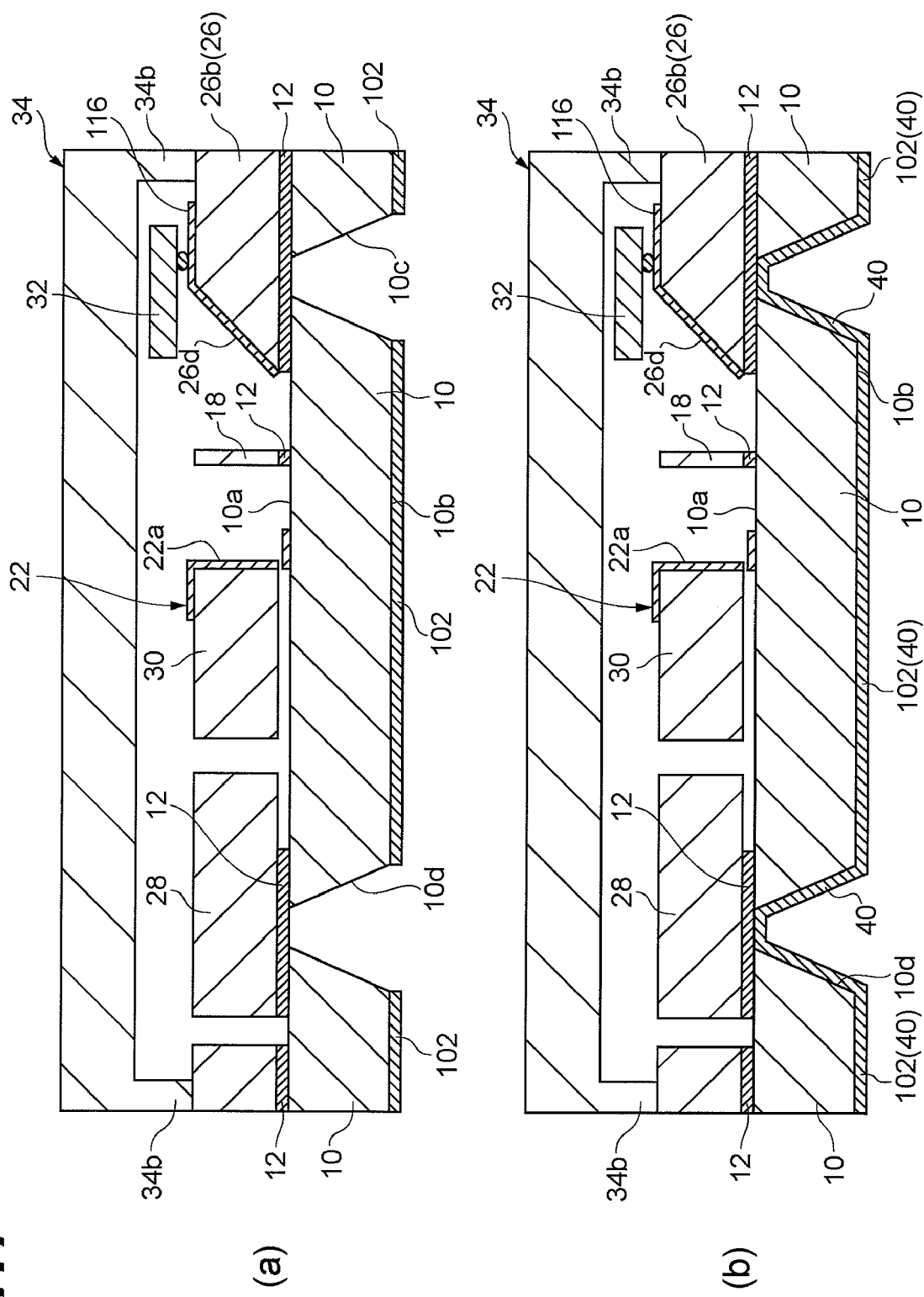
FIG. 17 is a figure including diagrams showing manufacturing steps of the optical module 1A, that show end elevational views of the optical module 1A in the process of manufacturing.

Next, as shown in (a) in FIG. 17, wet etching is applied to the support substrate 10 via the Si oxide film 102. At this time, anisotropic etching is applied to the exposed portions of the support substrate 10 by use of, for example, alkaline etching.

Thereby, the substantially conical through holes 10c and 10d as shown in FIG. 17(a) are formed in the support substrate 10. At this time, in the case in which the cap member is not made of a material such as glass which is not subject to etching, glass or the like is pasted on the cap member with wax or a nitride film is formed on the cap member, to protect the cap member. Thereafter, as shown in (b) in FIG. 17, the insulating films 40 are formed on the inner side faces of the through holes 10c and 10d in the support substrate 10. At this time, it is preferable that Si oxide films be formed by, for example, a TEOS-CVD method using tetraethoxysilane as the insulating films 40.

Figure 18:
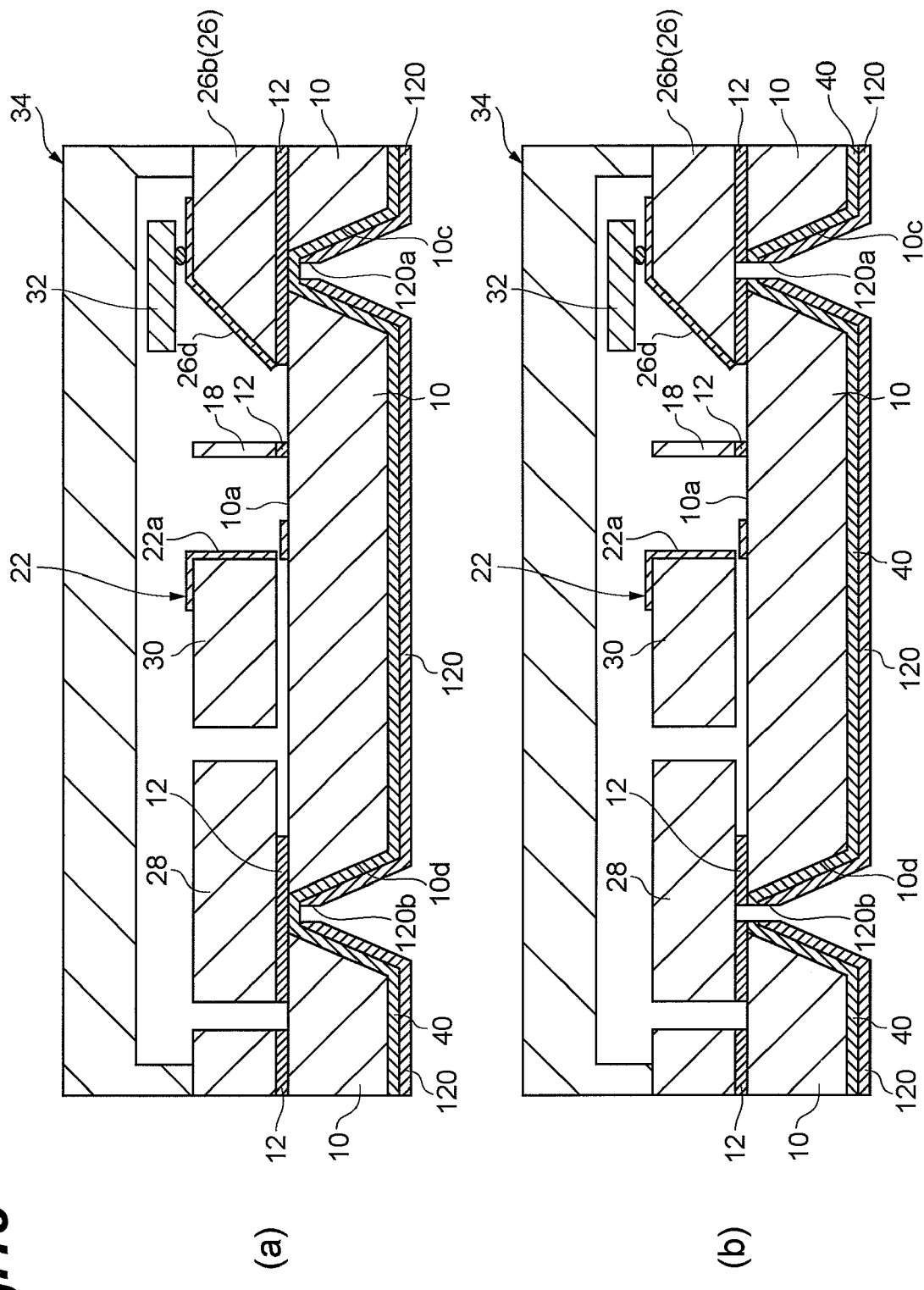
FIG. 18 is a figure including diagrams showing manufacturing steps of the optical module 1A, that show end elevational views of the optical module 1A in the process of manufacturing.

Next, as shown in (a) in FIG. 18, a resist pattern 120 is formed on the Si oxide film 102 (the insulating film 40) formed on the surface 10b of the support substrate 10 and the insulating films 40 formed on the inner side faces of the through holes 10c and 10d. The resist pattern 120 is formed by, for example, spray coating, and has openings 120a and 120b respectively in the portions corresponding to the ends of the through holes 10c and 10d. Then, dry etching is applied thereto via the resist pattern 120, to form through holes in the insulating films 40 and the insulating layers 12 as shown in (b) in FIG. 18. Thereby, the semiconductor layers 14 in the element mounting part 26 and the first electrode 28 are exposed. Thereafter, the resist pattern 120 is eliminated.

Figure 19:
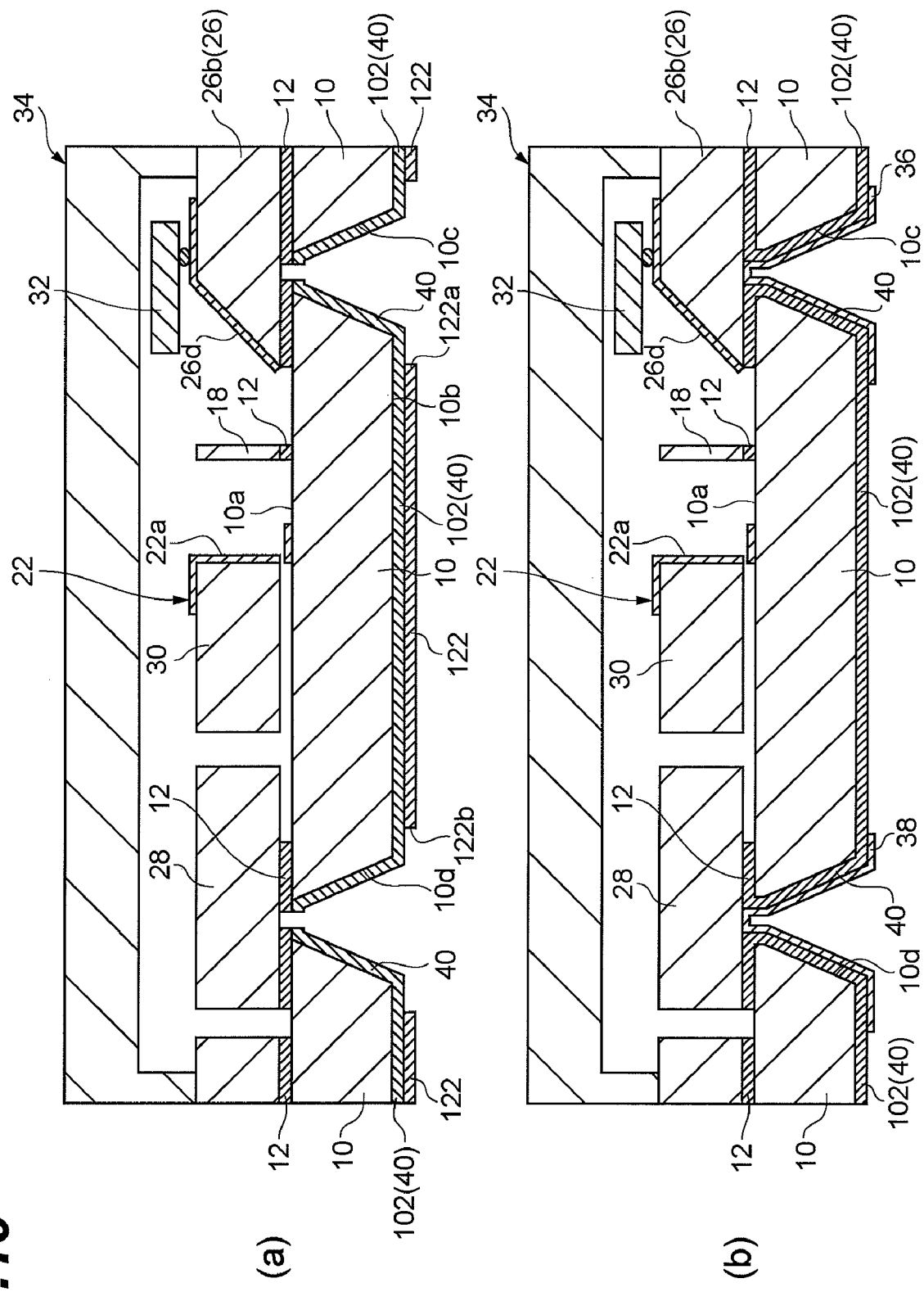
FIG. 19 is a figure including diagrams showing manufacturing steps of the optical module 1A, that show end elevational views of the optical module 1A in the process of manufacturing.

Next, as shown in (a) in FIG. 19, a resist pattern 122 is formed on the Si oxide film 102 (the insulating film 40) formed on the surface 10b of the support substrate 10 by, for example, spray coating. The resist pattern 122 has openings 122a and 122b through which the through holes 10c and 10d and the insulating films 40 formed on the peripheral portions thereof are exposed. Then, metal films are formed on the insulating films 40 by a liftoff technology utilizing the resist pattern 122. This metal films are the element electrode part 36 and the actuator electrode part 38 shown in (b) in FIG. 19.

Figure 20:
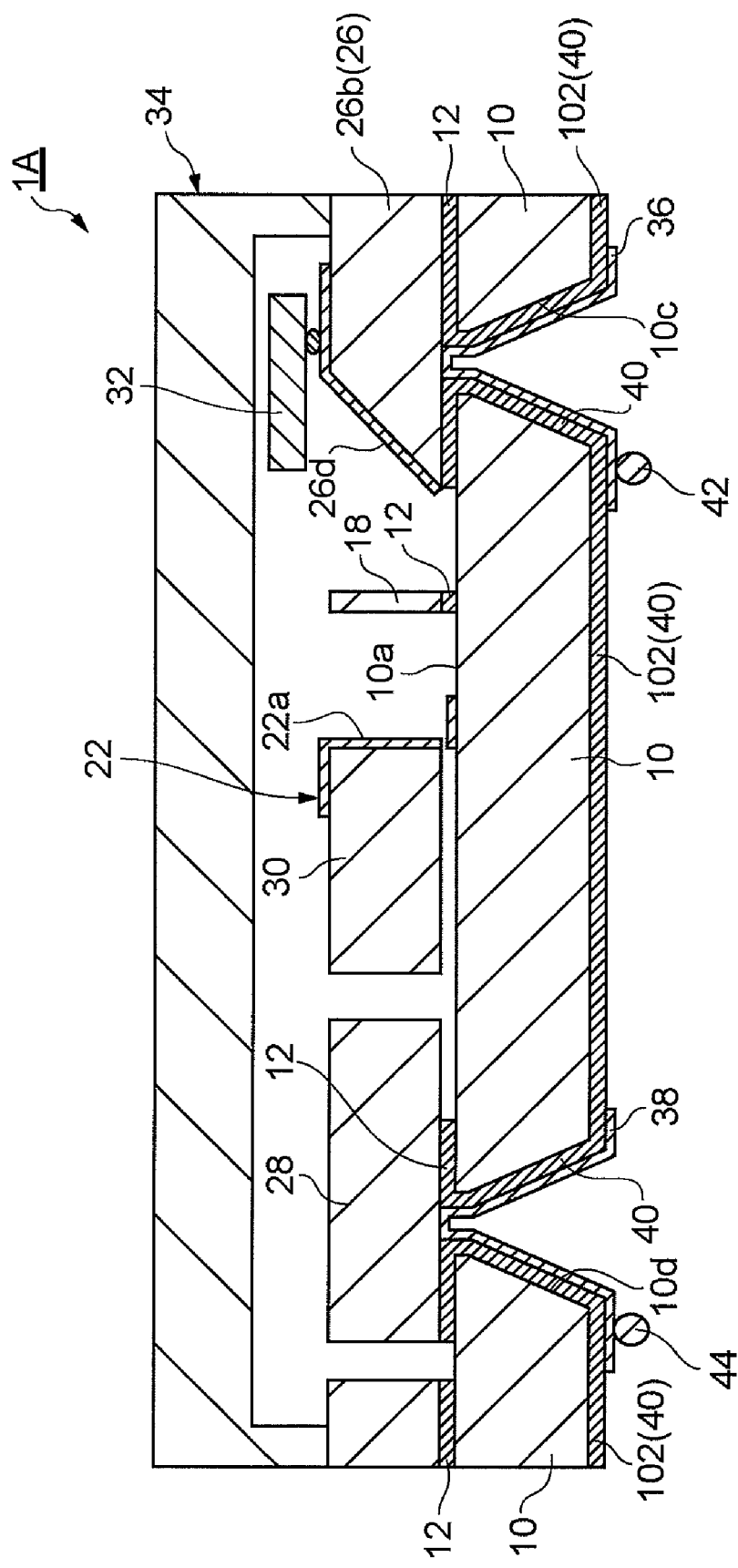
FIG. 20 is a diagram showing a manufacturing step of the optical module 1A, that shows an end elevational view of the optical module 1A in the process of manufacturing.

Finally, as shown in FIG. 20, the bump electrodes 42 and 44 are formed on the portions, which are formed on the Si oxide films 102 (the insulating films 40), of the element electrode part 36 and the actuator electrode part 38. In this way, the optical module 1A shown in FIG. 1 is completed.

Advantageous effects obtained by the optical module 1A described above will be described. In a MEMS device having a portion, such as the movable mirror 22, which can be driven, because its driving portion is from several μm to several tens of μm, that is minute, its operation may be difficult due to adherence of dust or moisture in some cases. However, in a dicing step essential for a semiconductor process at the time of manufacturing a MEMS device, powder dust is invariably generated. Further, in the case of blade dicing, because the step is performed while spraying water, not only powder dust, but also moisture adheres thereto. Accordingly, it is necessary to protect the driving portion from dust and moisture. As an effective method to protect a driving portion, there is devised a method in which an area including a driving portion is airtight-sealed up before a dicing step. However, as described above, it is difficult to achieve sufficient airtightness in accordance with the configuration disclosed in Patent Document 1, and the entire apparatus is made large in size.

In the optical module 1A according to the present embodiment, the photodiode 32 is provided on the support substrate 10, and the photodiode 32 and the movable mirror 22 are together airtight-sealed with the cap member 34. Then, the photodiode 32 and the mirror surface 22a of the movable mirror 22 are optically coupled. In accordance with such a configuration, there is no need to install an optical fiber for connecting to an external detector or the like, and therefore, it is possible to enhance the airtightness of the interference optical system including the movable mirror 22 with the cap member 34. Further, because the photodiode 32 is provided on the support substrate 10, there is no need to provide a photodetector or the like outside the device, which makes it possible to downsize the module.

Further, in the case in which it is necessary to energize the structural members or electric elements on the support substrate 10, generally, a wiring pattern is formed on the support substrate 10, to be led out to the outside of the package of the module. However, the airtightness of the optical system including the movable mirror 22 may be deteriorated due to the irregularity generated by such a wiring. There is also a method in which a place contacting the cap member 34 is covered with an insulating film, and the insulating film is ground to flatten the contacting surface with the cap member 34, however, not only is the number of steps increased, but also, in some cases, it may be impossible to utilize such a method depending on the type of device. Further, in the case in which there are the first electrode 28 and the second electrode 30 electrically independent of each other as in the electrostatic actuator 24 of the present embodiment, it is impossible to lead out a wiring pattern for interfacing to the outside of the module. In this case, an electric connection is carried out with a bonding wire, however, the wire is provided already at the stage before a dicing step, which leads to a strong possibility of damaging in carriage of the substrate.

In contrast thereto, in the optical module 1A according to the present embodiment, the element electrode part 36 electrically connected to the photodiode 32 is provided through the support substrate 10 and the insulating layer 12. Thereby, it is possible to energize the photodiode 32 from above the surface 10b of the support substrate 10, and therefore, there is no need to lead out a wiring pattern on the surface 10a of the support substrate 10, and it is possible to further enhance the airtightness of the optical system including the movable mirror 22 with the cap member 34. Further, there is no need to carry out wire bonding with respect to the first electrode 28 and the second electrode 30 electrically independent of each other, which also makes it easy to carry the substrate during manufacturing.

Further, as in the present embodiment, the optical module 1A may include the electrostatic actuator 24 that drives the movable mirror 22 by electrostatic force generated between the first electrode 28 and the second electrode 30, and the actuator electrode part 38 which is provided through the support substrate 10 and the insulating layer 12. Provided that the electrostatic actuator 24 having such a configuration is configured on the support substrate 10, it is possible to favorably drive the minute movable mirror 22.

Further, as in the present embodiment, the cap member 34 is preferably formed of a material that allows the light to be measured $L_1$, which is an object of light reception by the photodiode 32 to transmit through the cap member. Thereby, it is possible to input the light to be measured $L_1$ via the cap member 34 at the surface 10a side of the support substrate 10. Accordingly, there is no need to install a component such as an optical fiber for optical input on the surface 10a of the support substrate 10, and it is possible to further enhance the airtightness of the interference optical system including the movable mirror 22.

Further, as in the present embodiment, it is preferable that the element mounting part 26 including a portion of the semiconductor layer 14, on which the photodiode 32 is mounted, is provided, and the end of the element electrode part 36 contacts the portion of the semiconductor layer 14 in the element mounting part 26. Provided that the optical module 1A includes the element mounting part 26, it is possible to install the photodiode 32 on the support substrate 10 by flip-chip configuration, and therefore, wire bonding for energizing the photodiode 32 is unneeded, which makes it easy to handle the support substrate 10 and the like during manufacturing. Further, because the portion of the semiconductor layer 14 in the element mounting part 26 and the element electrode part 36 contact each other, it is possible to easily achieve an electric connection between the element electrode part 36 and the photodiode 32.

Further, as in the present embodiment, it is preferable that the optical module 1A includes the bump electrode 42 which is provided on the surface 10b of the support substrate 10, to be electrically connected to the element electrode part 36. Thereby, it is possible to install the optical module 1A onto a wiring substrate or the like by a simple method such as a reflow method.

Here, until the cap member 34 is attached after the driving portions such as the movable mirror 22 and the second electrode 30 are formed, a wet process is not carried out in order to prevent difficulties in operations of the driving portions due to moisture. Accordingly, at the time of forming metal films, a method using a shadow mask is mainly used, however, this method has low dimensional accuracy, which makes it difficult to achieve minute wiring formation. In contrast thereto, in the optical module 1A according to the present embodiment, a function as a wiring is provided by physically isolating the conductive semiconductor layers 14, and because etching onto the semiconductor layer 14 is possible even with a minute line width of several tens of μm, most normal optical semiconductor elements can be installed. Here, the element electrode part 36 and the actuator electrode part 38 on the surface 10b are provided for interfacing to the outside, and therefore, minute accuracy is not required.

Second Embodiment

Figure 21:
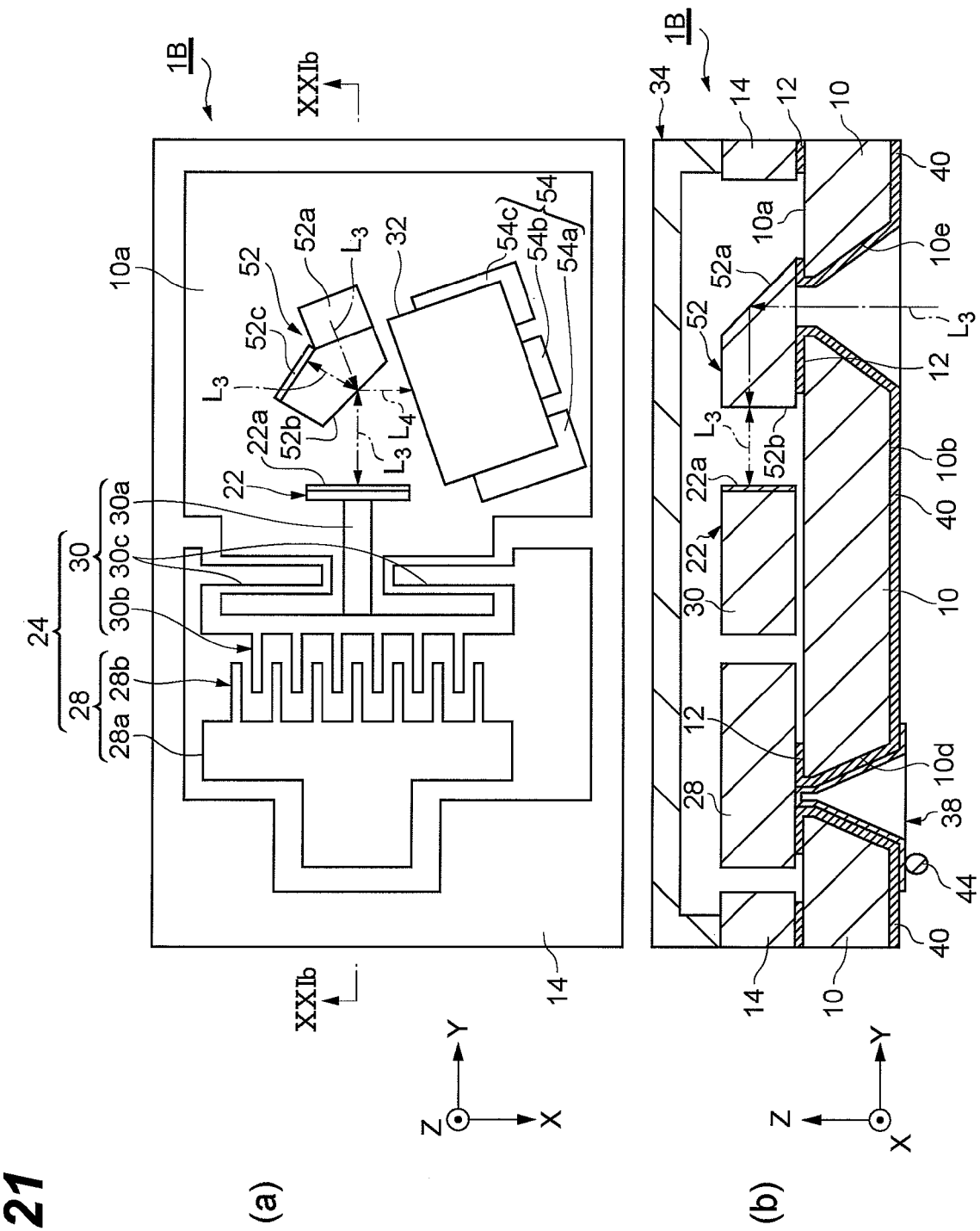
FIG. 21 is a figure including diagrams showing a configuration of an optical module 1B as a second embodiment of an optical module according to the present invention, that show (a) a plan view of the optical module 1B, and (b) a sectional side view of the optical module 1B taken along the line XXIb-XXIb in (a).

FIG. 21 shows diagrams showing a configuration of an optical module 1B as a second embodiment of an optical module according to the present invention. Here, (a) in FIG. 21 shows a plan view of the optical module 1B, and (b) in FIG. 21 shows a sectional side view of the optical module 1B taken along the line XXIb-XXIb in FIG. 21(a). Note that, in FIG. 21(a), the cap member 34 included in the optical module 1B is omitted in the illustration to facilitate understanding thereof. Further, XYZ orthogonal coordinate systems are shown in FIG. 21(a) and FIG. 21(b).

The optical module 1B of the present embodiment is manufactured from an SOI substrate in the same way as the optical module 1A of the first embodiment, and the optical module includes the support substrate 10, the insulating layer 12, and the semiconductor layer 14. Further, the movable mirror 22 and the electrostatic actuator 24 as parts of the structural members for constituting a Michelson interference optical system are formed in the insulating layer 12 and the semiconductor layer 14. Moreover, the optical module 1B includes the cap member 34, the actuator electrode part 38, and the bump electrode 44. The configurations of those are the same as those in the first embodiment, and detailed descriptions thereof will be omitted.

A difference between the optical module 1B according to the present embodiment and the optical module according to the first embodiment is as follows. That is, the optical module 1B according to the present embodiment includes an optical structural member 52 and an element mounting part 54 in place of the entrance mirror 16, the optical branching part 18, the fixed mirror 20, and the element mounting part 26 in the first embodiment. Further, a light pass-through hole 10e is formed in a portion of the support substrate 10 located immediately below the optical structural member 52. The light pass-through hole 10e is provided through the support substrate 10 and the insulating layer 12, and a light to be measured $L_3$ is input via the light pass-through hole 10e.

The optical structural member 52 is a structural member having the functions of the entrance mirror 16, the optical branching part 18, and the fixed mirror 20 in the first embodiment all together. The optical structural member 52 is primarily composed of a portion of the semiconductor layer 14, and is fixed to the surface 10a of the support substrate 10 via the insulating layer 12. A mirror surface 52a inclined to the surface 10a of the support substrate 10 and a semireflecting surface 52b and a mirror surface 52c extending in a direction perpendicular to the surface 10a (the Z-axis direction) are formed on the side faces of the optical structural member 52.

An inclined angle of the mirror surface 52a is, for example, 45 degrees to the surface 10a. The light to be measured $L_3$, passing through the light pass-through hole 10e formed in the support substrate 10 to transmit through the inside of the optical structural member 52, reaches the mirror surface 52a. The mirror surface 52a reflects the light to be measured $L_3$ toward the semireflecting surface 52b in plane along the surface 10a.

The semireflecting surface 52b is optically coupled to the mirror surfaces 52a and 52c, the mirror surface 22a of the movable mirror 22, and the element mounting part 54. The semireflecting surface 52b reflects a part of the light to be measured $L_3$ entering thereinto via the mirror surface 52a toward the mirror surface 52c. Further, the semireflecting surface 52b allows the other light to be measured $L_3$ except for the reflected part of the light to be measured $L_3$, to transmit therethrough toward the movable mirror 22. The movable mirror 22 reflects the light to be measured $L_3$ transmitting through the semireflecting surface 52b toward the semireflecting surface 52b. The light to be measured $L_3$ is reflected by the semireflecting surface 52b toward the element mounting part 54. Further, the mirror surface 52c reflects the light to be measured $L_3$ reflected by the semireflecting surface 52b, toward the semireflecting surface 52b. The light to be measured $L_3$ transmits through the semireflecting surface 52b toward the element mounting part 54, to be coupled to the light to be measured $L_3$ reaching there from the movable mirror 22 to become an interference optical image $L_4$.

The element mounting part 54 has the same structure as the element mounting part 26 in the first embodiment, and its layout and orientation are different from those in the first embodiment. That is, the element mounting part 54 is a structural member for mounting an optical semiconductor element such as a photodiode 32 thereon, and is composed of three portions 54a to 54c arrayed in a given direction. Metal films are formed on the top surfaces of these portions 54a to 54c, and the photodiode 32 is installed on these metal films. Here, although not illustrated, an element electrode part as well, which has the same structure as the element electrode part 36 in the first embodiment, is provided immediately below the element mounting part 54.

Further, a mirror surface inclined to the surface 10a is formed on a side face facing the semireflecting surface 52b among the side faces of the portion 54b. The interference optical image $L_4$ output from the semireflecting surface 52b enters into this mirror surface. This mirror surface reflects the interference optical image $L_4$ toward the Z-axis direction to provide it to the photodiode 32.

In accordance with the configuration as the optical module 1B according to the present embodiment, the same advantageous effects which are the same as those of the optical module 1A according to the first embodiment can be obtained. That is, because the photodiode 32 and the movable mirror 22 are together airtight-sealed with the cap member 34, there is no need to install an optical fiber for connecting to an external detector or the like, and therefore, it is possible to enhance the airtightness of the interference optical system including the movable mirror 22 with the cap member 34. Further, because the photodiode 32 is provided on the support substrate 10, there is no need to provide a photodetector or the like outside the device, which makes it possible to downsize the module.

Further, as in the present embodiment, the module may be configured such that the light to be measured $L_3$ received by the photodiode 32 is input via the light pass-through hole 10e provided through the support substrate 10 and the insulating layer 12. Thereby, it is possible to input the light to be measured $L_3$ from the surface 10b side of the support substrate 10. Accordingly, there is no need to install a component such as an optical fiber for optical input on the surface 10a of the support substrate 10, and it is possible to further enhance the airtightness of the interference optical system including the movable mirror 22. Here, provided that the light pass-through hole 10e is formed so as to penetrate through the insulating layer 12 as in the present embodiment, it is possible to avoid the light to be measured $L_3$ from being reflected by the insulating layer 12, to enhance the use efficiency of the light to be measured $L_3$.

The optical module according to the present invention is not limited to the above-described embodiments, and various modifications thereof are possible. For example, in the above-described respective embodiments, the photodiode that is a light receiving element is exemplified as an optical semiconductor element included in the optical module, however, the optical module according to the present invention may include a light emitting element as an optical semiconductor element. In this case, the lights to be measured $L_1$ and $L_3$ and the interference optical images $L_2$ and $L_4$ in above-described respective embodiments are replaced by a light emitted from the light emitting element. That is, a light emitted from the light emitting element transmits through the cap member 34 to be output in the first embodiment, and a light emitted from the light emitting element passes through the light pass-through hole 10e to be output in the second embodiment.

Further, in the above-described respective embodiments, the interference optical system is exemplified as an optical system included in the optical module, however, the optical module according to the present invention may include any optical system with a movable mirror and an optical semiconductor element, which even has another configuration.

Further, in the above-described respective embodiments, in order to prevent the light from being reflected by the surface of the cap member 34 or the bottom face of the optical structural member 52 when a light to be measured enters into the module, a nitride film ($Si_3N_4$) may be formed to have a thickness of $\lambda/4n$ ($\lambda$: wavelength of light to be measured, n: refractive index of nitride film) on these surfaces.

Here, the optical module according to the above-described embodiments is an optical module which is manufactured from a substrate product having a support substrate and a semiconductor layer disposed on one surface of the support substrate via an insulating layer, the optical module including a movable mirror which includes a portion of the semiconductor layer, and in which a mirror surface is formed on a side face intersecting with a predetermined direction, the movable mirror is movable in the predetermined direction along the one surface by eliminating the insulating layer between the portion and the support substrate, an optical semiconductor element which is provided on the one surface of the support substrate, and is optically coupled to the mirror surface of the movable mirror, a cap member which is provided on the one surface of the support substrate, the cap member airtight-seals the movable mirror and the optical semiconductor element, and an electrode part for element which is provided so as to penetrate through the support substrate and the insulating layer, and is electrically connected to the optical semiconductor element.

In addition, the optical module may be configured to further include an electrostatic actuator which has a first electrode fixed to the support substrate and a second electrode fixed to the movable mirror, the electrostatic actuator drives the movable mirror by electrostatic force generated between the first electrode and the second electrode, and an electrode part for actuator which is provided so as to penetrate through the support substrate and the insulating layer, and is electrically connected to the first electrode. Provided that the electrostatic actuator having such a configuration is configured on the support substrate, it is possible to favorably drive the minute movable mirror.

Further, the optical module may be configured such that the cap member is formed of a material that allows a light received or emitted by the optical semiconductor element to transmit through the cap member. Thereby, it is possible to input or output an entering light or an emitted light via the cap member at the one surface side of the support substrate. Or, the optical module may be configured to have a light pass-through hole penetrating through the support substrate and the insulating layer, and a light received or emitted by the optical semiconductor element is input or output via the light pass-through hole. Thereby, it is possible to input or output an entering light or an emitted light via the light pass-through hole at the other surface side of the support substrate. Accordingly, provided that the optical module further includes one of those configurations, there is no need to install a component such as an optical fiber for optical input or optical output on the one surface of the support substrate, and it is possible to further enhance the airtightness of the optical system including the movable mirror.

In addition, the optical module may be configured to further include a fixed mirror which includes a portion of the semiconductor layer, and in which a mirror surface is formed on one side face, the fixed mirror is fixed on the one surface of the support substrate, and a beam splitter which includes a portion of the semiconductor layer, and in which one surface is optically coupled to the mirror surface of the movable mirror, and the other surface is optically coupled to the mirror surface of the fixed minor, and the mirror surface of the movable minor, the mirror surface of the fixed mirror, and the beam splitter constitute an interferometer.

Further, the optical module may be configured to further include an element mounting part including a portion of the semiconductor layer, on which the optical semiconductor element is mounted, and a leading end of the electrode part for element is in contact with the portion of the semiconductor layer in the element mounting part. Provided that the optical module includes such an element mounting part, it is possible to install the optical semiconductor element by flip-chip configuration on the support substrate, and therefore, wire bonding for making an electric connection with the optical semiconductor element is unneeded, which makes it easy to handle the support substrate and the like during manufacturing. Further, because the portion of the semiconductor layer in the element mounting part and the element electrode part contact each other, it is possible to easily achieve an electric connection between the element electrode part and the optical semiconductor element.

Further, the optical module may be configured to further include a bump electrode which is provided on the other surface of the support substrate, and is electrically connected to the electrode part for element. Thereby, it is possible to install the optical module onto a wiring substrate or the like by a simple method such as a reflow method.

The present invention can be utilized as an optical module which is capable of enhancing the airtightness of an optical system including a movable mirror, and which also can be downsized.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An optical module which is manufactured from a substrate product having a support substrate and a semiconductor layer disposed on one surface of the support substrate via an insulating layer, the optical module comprising:
  a movable mirror which includes a portion of the semiconductor layer, and in which a mirror surface is formed on a side face intersecting with a predetermined direction, the movable mirror is movable in the predetermined direction along the one surface by eliminating the insulating layer between the portion of the semiconductor layer and the support substrate;
  an optical semiconductor element which is a light receiving element or a light emitting element, which is provided on the one surface of the support substrate, and is optically coupled to the mirror surface of the movable mirror,
  a cap member which is provided on the one surface of the support substrate, the cap member airtight-seals the movable mirror and the optical semiconductor element; and
  an element electrode part which is provided through the support substrate and the insulating layer, and is electrically connected to the optical semiconductor element.

2. The optical module according to claim 1, further comprising:
  an electrostatic actuator which has a first electrode fixed to the support substrate and a second electrode fixed to the movable mirror, the electrostatic actuator drives the movable mirror by electrostatic force generated between the first electrode and the second electrode; and
  an actuator electrode part which is provided through the support substrate and the insulating layer, and is electrically connected to the first electrode.

3. The optical module according to claim 1, wherein the cap member is formed of a material that allows a light received or emitted by the optical semiconductor element to transmit through the cap member.

4. The optical module according to claim 1, wherein a light pass-through hole is provided through the support substrate and the insulating layer, and wherein a light received or emitted by the optical semiconductor element is input or output via the light pass-through hole.

5. The optical module according to claim 1, further comprising:
  a fixed mirror which includes a portion of the semiconductor layer, and in which a mirror surface is formed on one side face, the fixed mirror is fixed on the one surface of the support substrate; and
  a beam splitter which includes a portion of the semiconductor layer, and in which one surface is optically coupled to the mirror surface of the movable mirror, and the other surface is optically coupled to the mirror surface of the fixed mirror, wherein
  the mirror surface of the movable mirror, the mirror surface of the fixed mirror, and the beam splitter constitute an interferometer.

6. The optical module according to claim 1, further comprising an element mounting part including a portion of the semiconductor layer, on which the optical semiconductor element is mounted, wherein
  an end of the element electrode part is in contact with the portion of the semiconductor layer in the element mounting part.

7. The optical module according to claim 1, further comprising a bump electrode which is provided on the other surface of the support substrate, and is electrically connected to the element electrode part.

8. An optical module which is manufactured from a substrate product having a support substrate and a semiconductor layer disposed on one surface of the support substrate via an insulating layer, the optical module comprising:
  a movable mirror which includes a portion of the semiconductor layer, and in which a mirror surface is formed on a side face intersecting with a predetermined direction, the movable mirror is movable in the predetermined direction along the one surface by eliminating the insulating layer between the portion of the semiconductor layer and the support substrate;
  an optical semiconductor element which is provided on the one surface of the support substrate, and is optically coupled to the mirror surface of the movable mirror,
  a cap member which is provided on the one surface of the support substrate, the cap member airtight-seals the movable mirror and the optical semiconductor element;
  an element electrode part which is provided through the support substrate and the insulating layer, and is electrically connected to the optical semiconductor element;
  a fixed mirror which includes a portion of the semiconductor layer, and in which a mirror surface is formed on one side face, the fixed mirror is fixed on the one surface of the support substrate; and
  a beam splitter which includes a portion of the semiconductor layer, and in which one surface is optically coupled to the mirror surface of the movable mirror, and the other surface is optically coupled to the mirror surface of the fixed mirror, wherein
  the mirror surface of the movable mirror, the mirror surface of the fixed mirror, and the beam splitter constitute an interferometer.

* * * * *